United States Patent
Kikuchi et al.

(10) Patent No.: US 9,696,383 B2
(45) Date of Patent: Jul. 4, 2017

(54) BATTERY MONITORING SYSTEM, HOST CONTROLLER, AND BATTERY MONITORING DEVICE

(75) Inventors: Mutsumi Kikuchi, Hitachinaka (JP); Akihiko Kudo, Hitachinaka (JP); Tomonori Kanai, Hitachinaka (JP); Hikaru Miura, Hitachinaka (JP); Akihiko Emori, Tokyo (JP)

(73) Assignee: HITACHI AUTOMOTIVE SYSTEMS, LTD., Ibaraki (JP)

( * ) Notice: Subject to any disclaimer, the term of this patent is extended or adjusted under 35 U.S.C. 154(b) by 363 days.

(21) Appl. No.: 14/350,189

(22) PCT Filed: Oct. 7, 2011

(86) PCT No.: PCT/JP2011/073254
§ 371 (c)(1),
(2), (4) Date: Jul. 9, 2014

(87) PCT Pub. No.: WO2013/051157
PCT Pub. Date: Apr. 11, 2013

(65) Prior Publication Data
US 2014/0354291 A1    Dec. 4, 2014

(51) Int. Cl.
*G01R 31/36* (2006.01)
*H01M 10/44* (2006.01)
*H01M 10/48* (2006.01)
*H04Q 9/00* (2006.01)
*H04L 29/12* (2006.01)
*H02J 7/00* (2006.01)

(52) U.S. Cl.
CPC ..... *G01R 31/3606* (2013.01); *G01R 31/3648* (2013.01); *H01M 10/441* (2013.01);
(Continued)

(58) Field of Classification Search
CPC .................. G01R 31/3606; G01R 31/3648
(Continued)

(56) References Cited

U.S. PATENT DOCUMENTS 5,654,623 A * 8/1997 Shiga ................. G01R 31/3648
                                                       320/106
7,808,205 B2 * 10/2010 Rao ....................... H02J 7/0004
                                                       320/106
(Continued)

FOREIGN PATENT DOCUMENTS

JP    2002-110259 A    4/2002
JP    2009-072053 A    4/2009
(Continued)

*Primary Examiner* — Samuel Berhanu
*Assistant Examiner* — Tessema Kebede
(74) *Attorney, Agent, or Firm* — Volpe and Koenig, P.C.

(57) ABSTRACT

A battery monitoring system includes a plurality of battery monitoring devices connected to a battery formed by connecting a plurality of battery cell groups in series, and monitor a state of the battery for the respective battery cell groups, each of the plurality of battery cell groups being of one or a plurality of battery cells connected in series, and a controller that performs wireless communication with the plurality of battery monitoring devices. First identification information portions which are different from each other are set in the plurality of battery monitoring devices in advance, and second identification information corresponding to an order of potentials of the battery cell groups in the battery, to which the battery monitoring devices are connected, is assigned to each of the plurality of battery monitoring devices. The controller stores a relationship between the first and second identification information for each battery monitoring device.

7 Claims, 15 Drawing Sheets

(52) U.S. Cl.
CPC ......... *H01M 10/482* (2013.01); *H02J 7/0016* (2013.01); *H04L 61/2038* (2013.01); *H04Q 9/00* (2013.01); *H02J 7/0021* (2013.01); *H04Q 2209/10* (2013.01); *H04Q 2209/40* (2013.01); *Y02T 10/7055* (2013.01)

(58) Field of Classification Search
USPC ........................................................ 324/434
See application file for complete search history.

(56) References Cited

U.S. PATENT DOCUMENTS

| | | | |
|---|---|---|---|
| 8,436,575 B2 * | 5/2013 | Sim .................... | H01M 10/482 320/106 |
| 2009/0052417 A1 * | 2/2009 | Sakamoto ......... | H04W 52/0229 370/338 |
| 2009/0130541 A1 * | 5/2009 | Emori .................. | H02J 7/0019 429/61 |
| 2012/0112685 A1 * | 5/2012 | Hartley ................ | B60L 3/0038 320/106 |

FOREIGN PATENT DOCUMENTS

| | | |
|---|---|---|
| JP | 2010-081716 A | 4/2010 |
| JP | 2010-146991 A | 7/2010 |
| JP | 2011-034964 A | 2/2011 |
| JP | 2013-085363 A | 5/2013 |
| KR | WO2007046657 A1 * | 4/2007 |
| WO | 2013/051156 A1 | 4/2013 |
| WO | 2013/051688 A1 | 4/2013 |

* cited by examiner

BATTERY MONITORING SYSTEM, HOST CONTROLLER, AND BATTERY MONITORING DEVICE

TECHNICAL FIELD

The present invention relates to a battery monitoring system, a host controller, and a battery monitoring device.

BACKGROUND ART

In the related art, a battery information management system is known in which a battery information acquisition module is connected to each battery cell, and battery information acquired by a battery information acquisition circuit is wirelessly transmitted from a wireless circuit to a management unit in each battery information acquisition module (refer to PTL 1). In this system, a unique ID is given to the wireless circuit of each battery information acquisition module, and the ID is transmitted along with battery information, so that the management unit can recognize the battery information on a corresponding battery cell.

CITATION LIST

Patent Literature

PTL 1: JP-A-2010-81716

SUMMARY OF INVENTION

Technical Problem

In the above-described system disclosed in PTL 1, it is necessary that the battery information acquisition module be connected to any battery cell, and then a correspondence relationship between the ID given to the wireless circuit of each battery information acquisition module and a connected battery cell be set in the management unit in advance. However, no detailed description of a setting method of the correspondence relationship is made in PTL 1, and thus there is a problem in that the management unit cannot properly identify battery information transmitted from each battery information acquisition module.

Solution to Problem

According to a first aspect of the present invention, there is provided a battery monitoring system including a plurality of battery monitoring devices that are connected to a battery formed by connecting a plurality of battery cell groups in series to each other, and monitor a state of the battery for the respective battery cell groups, each of the plurality of battery cell groups being formed by one or a plurality of battery cells connected in series; and a host controller that performs wireless communication with the plurality of battery monitoring devices. In the battery monitoring system, first identification information pieces which are different from each other are set in the plurality of battery monitoring devices in advance, and second identification information corresponding to an order of potentials of the battery cell groups in the battery, to which the battery monitoring devices are connected, is assigned to each of the plurality of battery monitoring devices. In addition, the host controller stores a correspondence relationship between the first identification information and the second identification information for each of the plurality of battery monitoring devices.

According to a second aspect of the present, invention, the battery monitoring system of the first aspect may further include an inspection device that can perform wireless communication with the plurality of battery monitoring devices and the host controller. In the battery monitoring system, preferably, the inspection device sequentially performs a reading process of reading the first identification information and an assignment process of assigning the second identification information on the plurality of respective battery monitoring devices in the order of potentials. In addition, preferably, the inspection device transmits the first identification information read due to the reading process and the second identification information assigned due to the assignment process to the host controller in correlation with each other for each battery monitoring device, and the host controller stores a correspondence relationship between the first identification information and the second identification information on the basis of the first identification information and the second identification information transmitted from the inspection device.

According to a third aspect of the present invention, in the battery monitoring system of the first aspect, each of the plurality of battery monitoring devices may include a potential measurement circuit that measures the potential, and transmit the potential measured by the potential measurement circuit and the first identification information to the host controller, and the host controller may determine and store a correspondence relationship between the first identification information and the second, identification information on the basis of the potential and the first identification information transmitted from each of the plurality of battery monitoring devices.

According to a fourth aspect of the present invention, in the battery monitoring system of the first aspect, the host controller may sequentially set communication ranges for performing wireless communication with the plurality of respective battery monitoring devices in the order of potentials on the basis of information set in advance, and the plurality of battery monitoring devices may sequentially transmit the first identification information pieces to the host controller in the order of potentials in accordance with the communication ranges. In addition, the host controller may determine and store a correspondence relationship between the first identification information and the second identification information on the basis of the first identification information pieces which are sequentially transmitted from the plurality of battery monitoring devices in the order of potentials.

According to a fifth aspect of the present invention, in the battery monitoring system of the first aspect, the host controller may sequentially set transmission electric powers or antenna gains for performing wireless communication with the plurality of respective battery monitoring devices in the order of potentials on the basis of information set in advance, and the plurality of battery monitoring devices may sequentially transmit the first identification information pieces to the host controller in the order of potentials in accordance with the transmission electric powers or the antenna gains. In addition, the host controller may determine and store a correspondence relationship between the first identification information and the second identification information on the basis of the first identification information pieces which are sequentially transmitted from the plurality of battery monitoring devices in the order of potentials.

According to a sixth aspect of the present invention, in the battery monitoring system of the first aspect, the host controller may transmit an assignment command for assigning the second identification information to a battery monitoring device connected to a highest-order battery cell group among the plurality of battery cell groups, and, when the assignment command is received from the host controller, the battery monitoring device connected to the highest-order battery cell group may assign highest-order identification information thereto as the second identification information, and transmit the first identification information for the battery monitoring device and the assignment command to a battery monitoring device connected to a one-order-lower battery cell group. In addition, when the assignment command is received from a battery monitoring device connected to a one-order-higher battery cell group, a battery monitoring device connected to an intermediate-order battery cell group among the plurality of battery cell groups may assign corresponding-order identification information thereto as the second identification information, and transmit the first identification information for the battery monitoring device and higher-order battery monitoring devices, and the assignment command to a battery monitoring device connected to a one-order-lower battery cell group. Further, when the assignment command is received from a battery monitoring device connected to a one-order-higher battery cell group, a battery monitoring device connected to a lowest-order battery cell group among the plurality of battery cell groups may assign lowest-order identification information thereto as the second identification information, and transmit the first identification information for the battery monitoring device and higher-order battery monitoring devices, and the assignment command to the host controller. Furthermore, the host controller may store a correspondence relationship between the first identification information and the second identification information on the basis of the first information pieces for the respective battery monitoring devices transmitted from the battery monitoring device connected to the lowest-order battery cell group.

According to a seventh aspect of the present invention, there is provided a host controller which performs wireless communication with a plurality of battery monitoring devices that are connected to a battery formed by connecting a plurality of battery cell groups in series to each other, and that monitor a state of the battery for the respective battery cell groups, each of the plurality of battery cell groups being formed by one or a plurality of battery cells connected in series, in which the host controller assigns identification information corresponding to an order of potentials of the battery cell groups in the battery, to which the battery monitoring devices are connected, to each of the plurality of battery monitoring devices.

According to an eighth aspect of the present invention, the host controller of the seventh aspect may assign the identification information to each of the plurality of battery monitoring devices on the basis of the potentials transmitted from the plurality of battery monitoring devices.

According to a ninth aspect of the present invention, the host controller of the seventh aspect may sequentially set communication ranges for performing wireless communication with the plurality of respective battery monitoring devices in the order of potentials on the basis of information set in advance, and assign the identification information thereto.

According to a tenth aspect of the present invention, the host controller of the seventh aspect may sequentially set transmission electric powers or antenna gains for performing wireless communication with the plurality of respective battery monitoring devices in the order of potentials on the basis of information set in advance, and assign the identification information thereto.

According to an eleventh aspect of the present invention, there is provided a battery monitoring device which is connected to any one of a plurality of battery cell groups and monitors a state of a battery for the battery cell group, in the battery formed by connecting the plurality of battery cell groups in series to each other, each battery cell group being formed by one or a plurality of battery cells connected in series, in which the battery monitoring device stores identification information assigned in accordance with an order of potentials of the battery cell group in the battery, and performs wireless communication with a host controller on the basis of the identification information.

According to a twelfth aspect of the present invention, the battery monitoring device of the eleventh aspect may include a potential measurement circuit that measures the potential, and the potential measured by the potential measurement circuit may be transmitted to the host controller. In addition, the identification information may be assigned by the host controller on the basis of the transmitted potential.

According to a thirteenth aspect of the present invention, in the battery monitoring device of the eleventh aspect, when an assignment command transmitted from the host controller or a battery monitoring device connected to a one-order-higher battery cell group is received, the battery monitoring device may assign the identification information thereto, and transmit the assignment command to a battery monitoring device connected to a one-order-lower battery cell group or the host controller.

Advantageous Effects of Invention

According to the present invention, in a battery monitoring system which transmits and receives information by using a wireless signal between a plurality of battery monitoring devices and a host controller, the host controller can properly identify information from each battery monitoring device.

DESCRIPTION OF EMBODIMENTS

Driving System of Rotating Electric Machine for Vehicle

Figure 1:
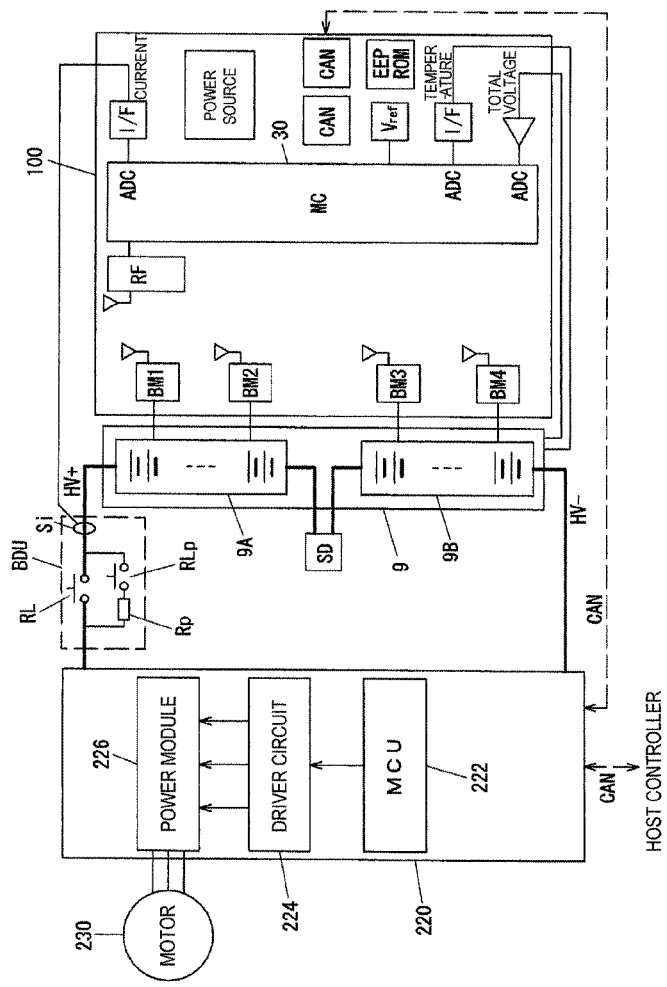
FIG. 1 is a block diagram illustrating a driving system of a rotating electric machine for a vehicle.

Hereinafter, with reference to the drawings, a description will be made of a driving system of a rotating electric machine for a vehicle employing a battery monitoring system according to the present invention. FIG. 1 is a block diagram illustrating a driving system of a rotating electric machine for a vehicle employing a battery monitoring system according to the present invention. The driving system illustrated in FIG. 1 includes a battery module 9; a battery monitoring system 100 which monitors the battery module 9; an inverter device 220 which converts DC power from the battery module 9 into three-phase AC power; and a motor 230 for driving a vehicle. The motor 230 is driven by three-phase AC power from the inverter device 220. The inverter device 220 and the battery monitoring system 100 are connected to each other through CAN communication, and the inverter device 220 functions as a host controller (high-order controller) for the battery monitoring system 100. In addition, the inverter device 220 is operated on the basis of command information from a higher-order controller (not illustrated).

The inverter device 220 includes a power module 226, a driver circuit 224 which drives the power module 226, and an MCU 222 which controls the driver circuit 224. The power module 226 converts DC power supplied from the battery module 9 into three-phase AC power for driving the motor 230. In addition, although not illustrated, a smoothing capacitor with a large capacitance of about 700 µF to about 2000 µF is provided between high-voltage electricity lines HV+ and HV− via which the power module 226 is connected to the battery module 9. The smoothing capacitor has a function of reducing voltage noise which is applied to integrated circuits provided in the battery monitoring system 100.

Since electric charge of the smoothing capacitor is subsequently zero in an operation start state of the inverter device 220, a large initial current flows into the smoothing capacitor from the battery module 9 when a relay RL of a battery disconnect unit BDU described later is closed. There is a concern that the relay RL may be fused and be thus damaged due to this large current. In order to solve the problem, the MCU 222 first charges the smoothing capacitor by turning a precharge relay RLP to a closed state from an open state in response to a command from a higher-order controller when the motor 230 starts an operation. At this time, the smoothing capacitor is charged while a maximum current is restricted by using a resistor RP. Next, the relay RL is turned to a closed state from an open state, and power starts to be supplied from the battery module 9 to the inverter device 220. With this operation, the relay circuit can be protected, and a maximum current flowing through the battery module 9 or the inverter device 220 can be reduced to a predetermined value or less, thereby maintaining high safety.

The inverter device 220 controls a phase of AC power generated by the power module 226 with respect to a rotor of the motor 230, so that the motor 230 is operated as a generator during braking of a vehicle. In other words, regenerative braking control is performed, and thus electric power generated by an operation of the generator regenerates the battery module 9 so as to charge the battery module 9. Also in a case where a state of charge of the battery module 9 is lower than a reference state, the inverter device 220 operates the motor 230 as a generator. The three-phase AC power generated by the motor 230 is converted into DC power by the power module 226 so as to be supplied to the battery module 9. As a result, the battery module 9 is charged.

In a case where the battery module 9 is charged by the regenerative braking control, the MCU 222 controls the driver circuit 224 so as to generate a rotating magnetic field in a delay direction with respect to a rotation of the rotor of the motor 230. In response to the control, the driver circuit 224 controls a switching operation of the power module 226. Accordingly, AC power from the motor 230 is supplied to the power module 226, and is converted into DC power by the power module 226 so as to be supplied to the battery module 9. As a result, the motor 230 functions as a generator.

On the other hand, in a case where the motor 230 is in a powering operation, the MCU 222 controls the driver circuit 224 so as to generate a rotating magnetic field in a progressive direction with respect to a rotation of the rotor of the motor 230 in response to a command from the host controller. In response to the control, the driver circuit 224 controls a switching operation of the power module 226. Accordingly, DC power from the battery module 9 is supplied to the power module 226, and is converted into AC power by the power module 226 so as to be supplied to the motor 230.

The power module 226 of the inverter device 220 performs electrical connection and disconnection at a high speed so as to perform power conversion between DC power and AC power. At this time, since a large current is shut off at a high speed, a great voltage variation occurs due to inductance of a DC circuit. In order to minimize the voltage variation, the above-described smoothing capacitor with a large capacitance is provided in the inverter device 220.

The battery module 9 is formed by a plurality of battery module blocks. In the example illustrated in FIG. 1, two battery module blocks 9A and 9B which are connected in series to each other form the battery module 9. Each of the battery module blocks 9A and 9B includes a plurality of cell groups which are connected in series to each other, and the cell group is formed by a plurality of battery cells which are connected in series to each other. The battery module block 9A and the battery module block 9B are connected in series to each other via a service disconnect SD for maintenance and checking in which a switch and a fuse are connected in series to each other. If the service disconnect SD is opened and thus a direct connection circuit between the battery module blocks 9A and 9B is electrically disconnected, even if a connection to a circuit of the vehicle occurs at some place of the battery module blocks 9A and 9B, no current flows. With this configuration, it is possible to maintain high safety. In addition, if the service disconnect SD is opened during checking, since a high voltage is not applied to a human body even if an operator touches the lines HV+ and HV−, safety is ensured.

The battery disconnect unit BDU including the relay RL, the resistor RP, and the precharge relay RLP is provided at the high-voltage electricity line HV+ between the battery module 9 and the inverter device 220. The series circuit between the resistor RP and the precharge relay RLP is connected in parallel to the relay RL.

The battery monitoring system 100 mainly performs a measurement of voltages, a measurement of a total voltage, a measurement of a current, an adjustment of cell temperature and cell capacitance, and the like of the respective cells of the battery module 9 as monitoring operations for monitoring a state of the battery module 9. For this, the battery monitoring system 100 includes a plurality of battery monitoring devices BM1 to BM4 and a microcomputer 30 which controls the respective battery monitoring devices BM1 to BM4. The plurality of battery cells included in each of the battery module blocks 9A and 9B may be divided into a plurality of cell groups (battery packs). In the battery monitoring system 100, one of the battery monitoring devices BM1 to BM4 which monitor the battery cells included in each cell group is provided in each cell group. The microcomputer 30 functions as a host controller of the battery monitoring devices BM1 to BM4.

In the following, for simplification of description, each cell group is assumed to be formed by four battery cells which are connected in series to each other. In addition, each of the battery module blocks 9A and 9B is assumed to be formed by two cell groups. However, the number of battery cells included in each cell group is not limited to four, and may be five or more, and may be equal to or smaller than three. A cell group may be formed by a single battery cell. In other words, each of cell groups formed by a single or a plurality of battery cells connected in series to each other corresponds to a battery which is monitored by the battery monitoring devices BM1 to BM4. In addition, cell groups having different numbers of battery cells, for example, a cell group formed by four battery cells and a cell group formed by six battery cells may be combined together. The battery monitoring devices BM1 to BM4 which are provided so as to respectively correspond to the cell groups may employ ones which are designed so as to be used even if the number of battery cells included in such a cell group may be any number, for example, four, and five or more.

In order to obtain a voltage and a current required in an electric vehicle or a hybrid vehicle, a plurality of cell groups may be connected in series or in series and parallel to each other in each battery module block as described above. In addition, a plurality of battery module blocks may be connected in series or in series and parallel to each other.

Each of the battery monitoring devices BM1 to BM4 includes an antenna for performing wireless communication with the microcomputer 30. The microcomputer 30 is connected to a wireless communication portion RF including an antenna. The microcomputer 30 performs wireless communication with each of the battery monitoring devices BM1 to BM4 via the wireless communication portion RF, and instructs each of the battery monitoring devices BM1 to BM4 to monitor a state of a corresponding cell group. In addition, a monitoring result of a state of each cell group transmitted from each of the battery monitoring devices BM1 to BM4 is received.

A wireless signal which is transmitted from the microcomputer 30 to the battery monitoring devices BM1 to BM4 via the wireless communication portion RF includes address information for designating which of the battery monitoring devices BM1 to BM4 performs a monitoring operation, and command information for designating content of a monitoring operation which a battery monitoring device designated by the address information performs on a corresponding cell group. The wireless communication portion RF modulates the information output from the microcomputer 30 in a predetermined modulation method so as to generate a wireless signal which is thus transmitted to the battery monitoring devices BM1 to BM4.

Different unique IDs are set in advance in the battery monitoring devices BM1 to BM4 when manufactured. In addition, if the battery monitoring devices BM1 to BM4 are incorporated into the battery monitoring system 100 and are connected to the respective cell groups of the battery module 9, addresses of the respective battery monitoring devices BM1 to BM4 are set separately from the unique IDs. The addresses may be assigned on the basis of an order of potentials of the cell groups to which the respective battery monitoring devices BM1 to BM4 are connected in the battery module 9. In other words, the addresses may be sequentially assigned from the battery monitoring device BM1 connected to a cell group on the highest potential side in an order of the battery monitoring devices BM1 to BM4. A detailed assignment method of addresses to the battery monitoring devices BM1 to BM4 will be described later in detail.

The microcomputer 30 stores a correspondence relationship between the unique ID and the address for each of the battery monitoring devices BM1 to BM4. When a wireless signal is transmitted to the battery monitoring devices BM1 to BM4, the microcomputer 30 designates an address by the above-described address information so as to designate the battery monitoring device which is a monitoring target.

In addition, each of the battery monitoring devices BM1 to BM4 stores an address assigned thereto. When a monitoring result of a state of a corresponding cell group is transmitted to the microcomputer 30, each of the battery monitoring devices BM1 to BM4 transmits information on the address assigned thereto together therewith. Accordingly, the microcomputer 30 can discriminate which battery monitoring device has transmitted the monitoring result.

A current sensor Si such as a Hall element is provided in the battery disconnect unit BDU. An output from the current sensor Si is input to the microcomputer 30. Signals regarding a total voltage and a temperature of the battery module 9 are also input to the microcomputer 30, and are respectively measured by AD converters (ADCs) of the microcomputer 30. Temperature sensors are provided at a plurality of locations of the battery module blocks 9A and 9B.

—Configuration of Battery Monitoring Device—

Figure 2:
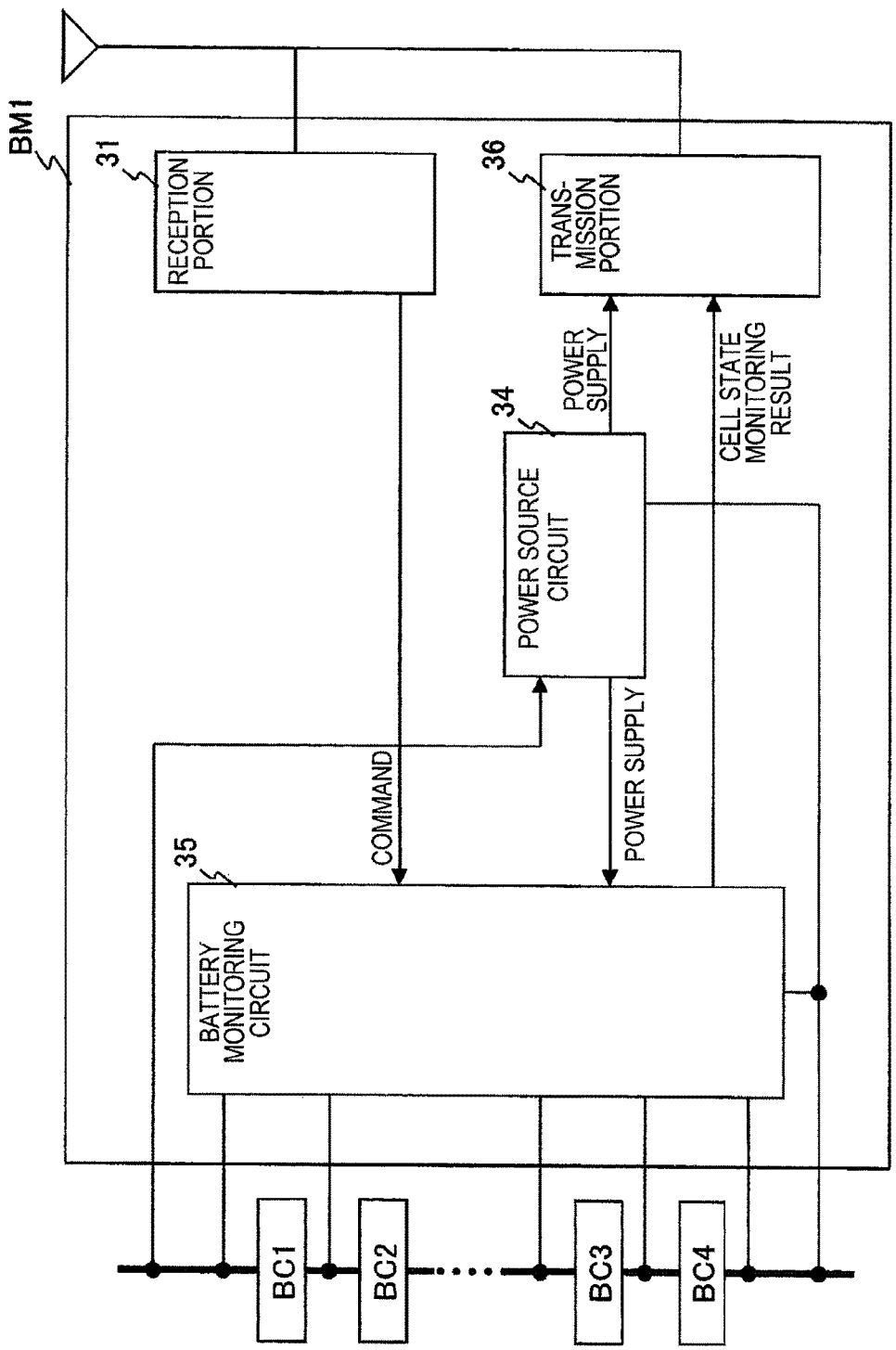
FIG. 2 is a block diagram of a battery monitoring device BM1.

FIG. 2 is a block diagram illustrating a configuration of the battery monitoring device BM1 according to the present invention. In addition, although not described, the other battery monitoring devices BM2 to BM4 also have the same configuration.

As illustrated in FIG. 2, the battery monitoring device BM1 includes a reception portion 31, a power source circuit 34, a battery monitoring circuit 35, and a transmission portion 36.

When a wireless signal transmitted from the microcomputer 30 is received, the reception portion 31 checks whether or not the wireless signal is transmitted to the battery monitoring device BM1. This checking may be performed by comparing an address indicated in the above-described address information included in the wireless signal with the address assigned to the battery monitoring device BM1, and determining whether or not the addresses match each other. As a result, if both addresses match each other, it is determined that the received wireless signal is a signal transmitted to the battery monitoring device BM1, and a command based on the above-described command information included in a demodulated signal is output to the battery monitoring circuit 35, and the demodulated signal is obtained by demodulating the wireless signal.

The power source circuit 34 supplies electric power to the battery monitoring circuit 35 and the transmission portion 36. The supply of electric power from the power source circuit 34 is performed by using electric power of battery cells BC1 to BC4 connected to the battery monitoring device BM1.

The battery monitoring circuit 35 is connected to the battery cells BC1 to BC4 forming a cell group corresponding to the battery monitoring device BM1, and performs a monitoring operation for monitoring states of the battery cells BC1 to BC4 in response to a command from the reception portion 31. At this time, the battery monitoring circuit 35 performs a monitoring operation of content designated by the command output from the reception portion 31, among the above-described various monitoring operations, on the battery cells BC1 to BC4. In other words, the command is output from the reception portion 31 to the battery monitoring circuit 35 on the basis of the command information included in the wireless signal from the microcomputer 30, and thus content of a monitoring operation performed by the battery monitoring circuit 35 is determined. The battery monitoring circuit 35 performs the monitoring operation on the battery cells BC1 to BC4, and outputs a result thereof to the transmission portion 36 as a cell state monitoring result.

The transmission portion 36 modulates the cell state monitoring result output from the battery monitoring circuit 35 in a predetermined modulation method so as to generate a wireless signal which is transmitted to the microcomputer 30 of FIG. 1. The microcomputer 30 receives the wireless signal transmitted from the transmission portion 36 via the wireless communication portion RF, so as to acquire the monitoring result on the battery cells BC1 to BC4 from the battery monitoring device BM1.

—Configuration of Battery Monitoring Circuit—

Figure 3:
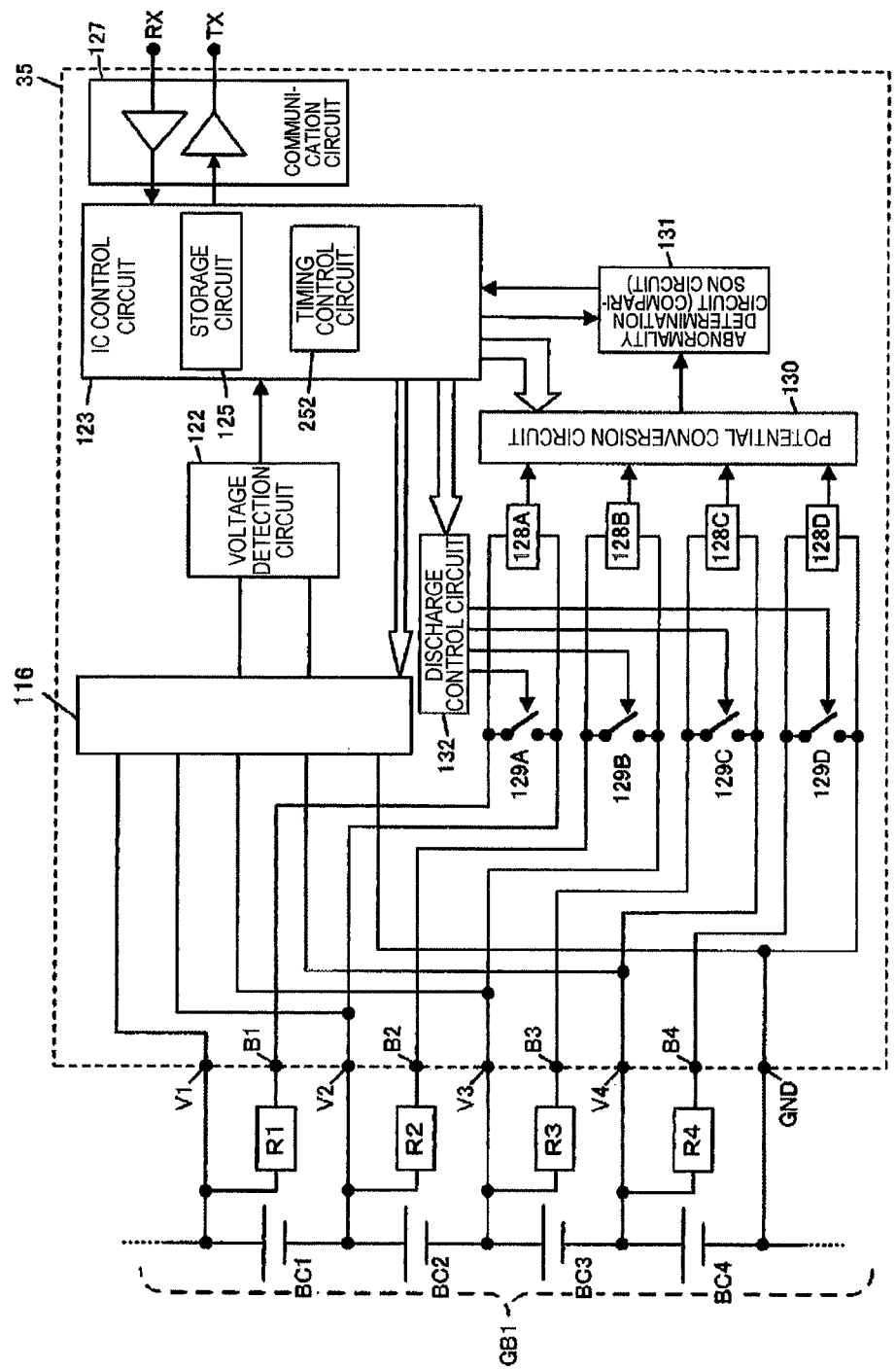
FIG. 3 is a block diagram of a battery monitoring circuit 35.

FIG. 3 is a diagram illustrating an internal block of the battery monitoring circuit 35 of the battery monitoring device BM1. In addition, although not described, the battery monitoring circuits 35 of the other battery monitoring devices BM2 to BM4 have the same configuration as that of the battery monitoring device BM1.

The battery module 9 of FIG. 1 is divided into four cell groups so as to correspond to the battery monitoring devices BM1 to BM4. A cell group GB1 corresponding to the battery monitoring device BM1 includes the four battery cells BC1 to BC4 illustrated in FIG. 2.

Respective input side terminals of the battery monitoring circuit 35 are connected to the battery cells BC1 to BC4 forming the cell group GB1. A positive terminal of the battery cell BC1 is connected to an input circuit 116 via the input terminal V1. The input circuit 116 includes a multiplexer. A positive terminal of the battery cell BC2 which is a negative terminal of the battery cell BC1 is connected to the input circuit 116 via an input terminal V2; a positive terminal of the battery cell BC3 which is a negative terminal of the battery cell BC2 is connected to the input circuit 116 via an input terminal V3; and a positive terminal of the battery cell BC4 which is a negative terminal of the battery cell BC3 is connected to the input circuit 116 via an input terminal V4. A negative terminal of the battery cell BC4 is connected to a terminal GND of the battery monitoring circuit 35.

A voltage detection circuit 122 has a circuit which converts each inter-terminal voltage of each of the battery cells BC1 to BC4 into a digital value. Each inter-terminal voltage converted into the digital value is sent to an IC control circuit 123, so as to be held in an internal storage circuit 125. This voltage is used for self diagnosis or the like, or is transmitted to the microcomputer 30 illustrated in FIG. 1.

The IC control circuit 123 has an operation function, and includes the storage circuit 125, and a timing control circuit 252 which periodically performs detection of various voltages or state diagnosis. The storage circuit 125 is formed by, for example, a register circuit. Each inter-terminal voltage of the battery cells BC1 to BC4 detected by the voltage detection circuit 122 is stored in the storage circuit 125 of the IC control circuit 123 in correlation with each of the battery cells BC1 to BC4. In addition, various other detected values may also be held in the storage circuit 125 so as to be read at predefined addresses.

The IC control circuit 123 is connected to a communication circuit 127. Via the communication circuit 127, the IC control circuit 123 receives a command from the microcomputer 30, output by the reception portion 31 of FIG. 2, and outputs a cell state monitoring result to the transmission portion 36 so as to transmit the cell state monitoring result to the microcomputer 30 by using the transmission portion 36. When the command is sent from the reception portion 31, the IC control circuit 123 interprets content of the command, and performs a process corresponding to the command content. Commands from the microcomputer 30 include, for example, a command for making a request for a measured value of an inter-terminal voltage of each of the battery cells BC1 to BC4, a command for making a request for a discharge operation in order to adjust a state of charge of each of the battery cells BC1 to BC4, a command (Wake UP) for starting an operation of the battery monitoring device BM1, a command (sleep) for stopping the operation, a command for making a request for address setting, and the like.

The positive terminal of the battery cell BC1 is connected to a terminal B1 of the battery monitoring circuit 35 via a resistor R1. A balancing switch 129A is provided between the terminal B1 and the terminal V2. The balancing switch 129A is connected in parallel to an operation state detection circuit 128A which detects an operation state of the switch. The balancing switch 129A is controlled so as to be turned on and off by a discharge control circuit 132. Similarly, the positive terminal of the battery cell BC2 is connected to a terminal B2 via a resistor R2, and a balancing switch 129B is provided between the terminal B2 and the terminal V3. The balancing switch 129B is connected in parallel to an operation state detection circuit 128B which detects an operation state of the switch. The balancing switch 129B is controlled so as to be turned on and off by the discharge control circuit 132.

The positive terminal of the battery cell BC3 is connected to a terminal B3 via a resistor R3, and a balancing switch 129C is provided between the terminal B3 and the terminal V4. The balancing switch 129C is connected in parallel to an operation state detection circuit 128C which detects an operation state of the switch. The balancing switch 129C is controlled so as to be turned on and off by the discharge control circuit 132. The positive terminal of the battery cell BC4 is connected to a terminal B4 via a resistor R4, and a balancing switch 129D is provided between the terminal B4 and the terminal GND. The balancing switch 129D is connected in parallel to an operation state detection circuit 128D which detects an operation state of the switch. The balancing switch 129D is controlled so as to be turned on and off by the discharge control circuit 132.

The operation state detection circuits 128A to 128D respectively repeatedly detect both-end voltages of the balancing switches 129A to 129D at a predetermined cycle, and detect whether or not each of the balancing switches 129A to 129D is operating normally. The balancing switches 129A to 129D are switches which adjust states of charge of the battery cells BC1 to BC4. In a case where the switches are operating abnormally, there is a concern that a state of charge of the battery cell cannot be controlled, and thus some battery cells are over-charged or over-discharged. For example, in a case where a certain balancing switch is turned on, but an inter-terminal voltage thereof indicates a terminal voltage of a corresponding battery cell, the balancing switch is detected to be operating abnormally. In this case, the balancing switch is not in a turned-on state based on a control signal. In addition, also in a case where a certain balancing switch is turned off, and an inter-terminal voltage thereof is a value lower than a terminal voltage of a battery cell, the balancing switch is detected to be operating abnormally. In this case, the balancing switch is turned on regardless of a control signal. A voltage detection circuit formed by, for example, a differential amplifier and the like is used in the operation state detection circuits 128A to 128D which detect an abnormal operation of the balancing switches 129A to 129D as mentioned above.

The balancing switches 129A to 129D are formed by, for example, a MOSFET, and have a function of releasing electric power accumulated in the corresponding battery cells BC1 to BC4. If an electrical load such as an inverter is connected to the battery module 9 in which a plurality of battery cells are connected in series to each other, the supply of a current to the electrical load is performed by all of the plurality of battery cells connected in series. At this time, if the respective battery cells are in different states of charge (SOC), a current is restricted by a state of a battery cell which is discharged to the highest degree in the battery module 9. On the other hand, in a state in which the battery module 9 is currently being charged, the supply of a current to the battery module 9 is performed to all of the plurality of battery cells connected in series. At this time, if the respective battery cells are in different states of charge (SOC), a current is restricted by a state of a battery cell which is charged to the highest degree in the battery module 9.

Therefore, in order to remove the restriction of a current depending on a difference in a state of charge of each battery cell as described above, the following balancing is performed as necessary. Specifically, in relation to a battery cell which is in a predetermined state of charge among the plurality of battery cells connected in series to each other in the battery module 9, for example, in a state of charge exceeding an average value of states of charge of the battery cells, a balancing switch connected to the battery cell is turned on. Accordingly, a discharge current is made to flow from the battery cell via the resistor which is connected in series to the turned-on balancing switch. As a result, control is performed so that states of charge of the respective battery cells become close to each other. As another method, there is a method in which a battery cell which is in the most discharged state in the battery module 9 is used as a reference cell, and a discharge time is determined on the basis of a difference of a state of charge from the reference cell. In addition, various balancing methods may be used to adjust a state of charge of each battery cell. Further, the state of charge of each battery cell may be obtained through calculation on the basis of a terminal voltage of each battery cell. Since there is a correspondence relationship between a state of charge of each battery cell and a terminal voltage, the balancing switches 129A to 129D are controlled so that voltage terminals of the respective battery cells become close to each other, and thus states of charge of the respective battery cells can become close to each other.

Inter-terminal voltages of the balancing switches 129A to 129D, that is, voltages between sources and drains of FETs forming the balancing switches 129A to 129D are respectively detected by the operation state detection circuits 128A to 128D, and are output to a potential conversion circuit 130. Here, a potential between the source and the drain of each FET is different from a reference potential, and it is difficult to perform comparison determination in this state. Therefore, such potentials are aligned by the potential conversion circuit 130, and then an abnormal operation is determined by an abnormality determination circuit 131. In addition, the potential conversion circuit 130 has a function of selecting a balancing switch to be diagnosed among the balancing switches 129A to 129D, on the basis of a control signal from the IC control circuit 123. When an inter-terminal voltage of the selected balancing switch is sent from the potential conversion circuit 130 to the abnormality determination circuit 131, the abnormality determination circuit 131 compares the inter-terminal voltage with a predetermined determination voltage on the basis of a control signal from the IC control circuit 123. Accordingly, the abnormality determination circuit 131 can determines whether or not the balancing switches 129A to 129D are operating normally.

A command signal for turning on a balancing switch corresponding to a battery cell to be discharged is sent from the IC control circuit 123 to the discharge control circuit 132. On the basis of this command signal, the discharge control circuit 132 outputs a signal corresponding to a gate voltage for turning on the balancing switches 129A to 129D which are formed by the MOSFET as described above.

The IC control circuit 123 receives a command for a discharge time corresponding to a battery cell and performs the above-described discharge operation in response to a command from the microcomputer 30 of FIG. 1. In addition, when an abnormal operation of the balancing switches 129A to 129D is detected, the IC control circuit 123 outputs the detection result to the transmission portion 36 as the cell state monitoring result illustrated in FIG. 2, thereby wirelessly transmitting the detection result to the microcomputer 30 from the transmission portion 36.

Next, a description will be made of a method of assigning addresses to the battery monitoring devices BM1 to BM4. In the present invention, various address assignment methods as described in the respective following embodiments may be used.

First Embodiment

Figure 4:
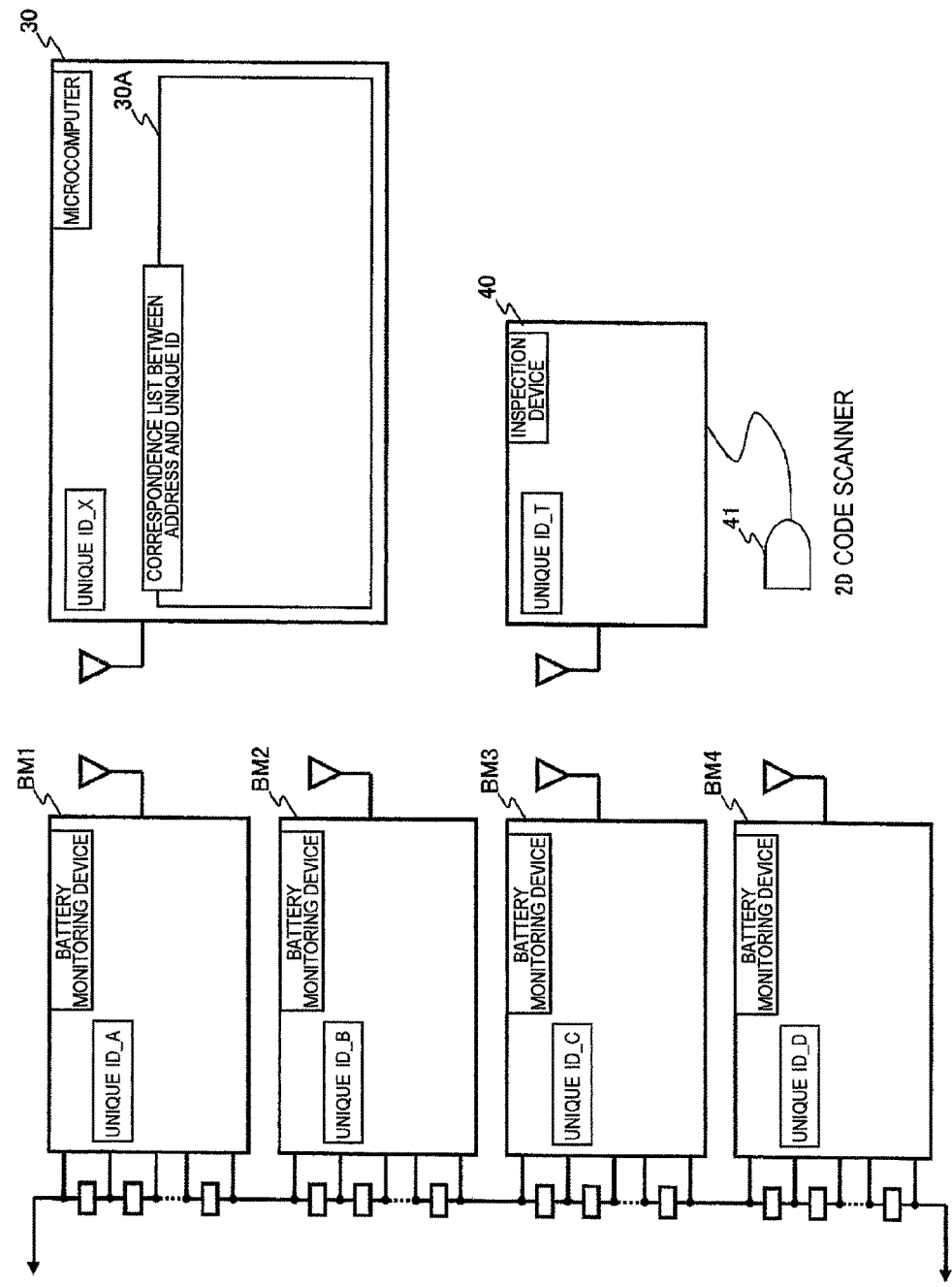
FIG. 4 is a diagram illustrating a schematic configuration of a battery monitoring system before an address is assigned according to a first embodiment.
Figure 5:
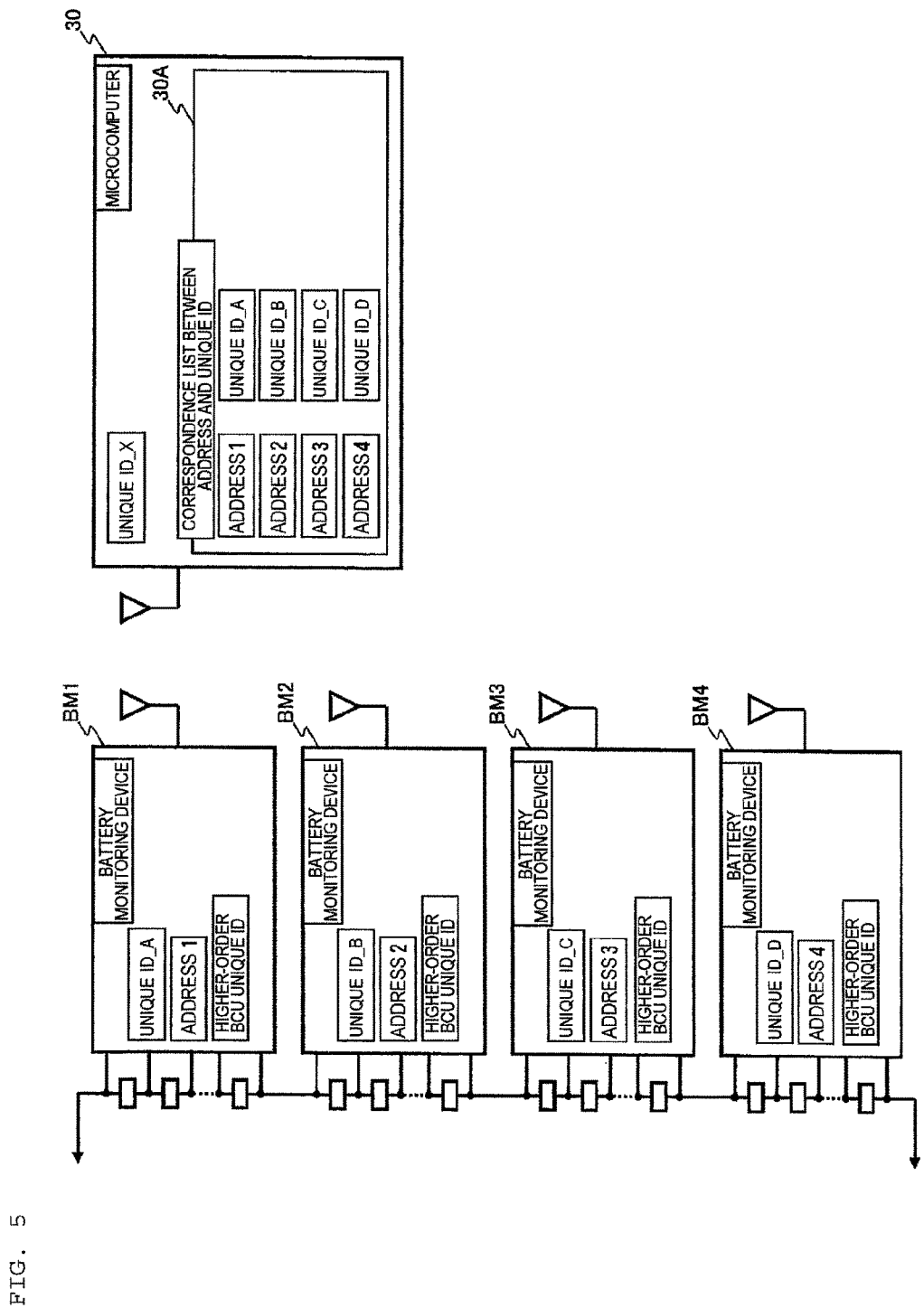
FIG. 5 is a diagram illustrating a schematic configuration of a battery monitoring system after an address is assigned according to the first embodiment.

FIGS. 4 and 5 are diagrams illustrating a schematic configuration of a battery monitoring system according to a first embodiment of the present invention. FIG. 4 illustrates a schematic configuration before an address is assigned, and FIG. 5 illustrates a schematic configuration after an address is assigned. In addition, in these schematic configuration diagrams, a part whose description is not necessary is not illustrated as compared with the battery monitoring system 100 of FIG. 1.

In FIG. 4, unique ID_A to ID_D are respectively set in advance in the battery monitoring devices BM1 to BM4. In addition, a unique ID_X is also set in the microcomputer 30. The microcomputer 30 has a storage region 30A which stores a correspondence list indicating a correspondence relationship between addresses assigned to the battery monitoring devices BM1 to BM4 and the unique IDs. As illustrated in FIG. 4, nothing is stored in the storage region 30A before addresses are assigned.

An inspection device 40 is a device which can performs wireless communication with the battery monitoring devices BM1 to BM4 and the microcomputer 30, and includes a two-dimensional code scanner 41. A unique ID_T is also set in the inspection device 40 in the same manner as in the battery monitoring devices BM1 to BM4 and the microcomputer 30.

Figure 6:
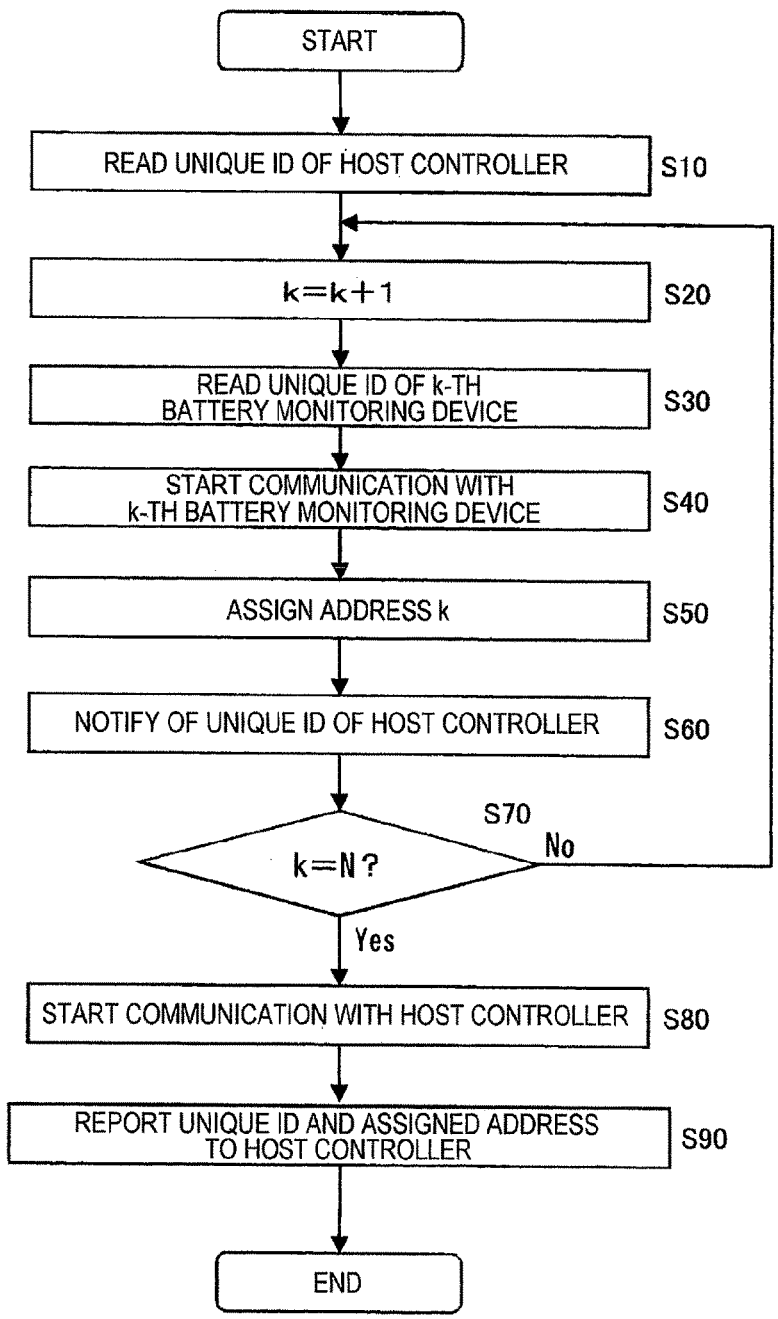
FIG. 6 is a flowchart illustrating procedures of an address assignment process according to the first embodiment.

FIG. 6 is a flowchart illustrating procedures of an address assignment process according to the first embodiment. In the present embodiment, the assignment of addresses to the battery monitoring devices BM1 to BM4 is performed according to procedures illustrated in the flowchart of FIG. 6, by using the inspection device 40.

In step S10, the inspection device 40 reads the unique ID_X of the microcomputer 30 which is a host controller of the battery monitoring devices BM1 to BM4. At this time, the inspection device 40 reads the unique ID_X by using the two-dimensional code scanner 41. For example, a two-dimensional code of the unique ID_X is written on a package surface or the like of the microcomputer 30, and is read by the two-dimensional code scanner 41, so that the inspection device 40 reads the unique ID_X. Alternatively, the inspection device 40 and the microcomputer 30 may be connected to each other in a wired manner or in a near field communication manner using infrared rays, and then the inspection device 40 may read the unique ID_X from the microcomputer 30. In addition, a user may input the unique ID_X to the inspection device 40, so that the inspection device 40 acquires the unique ID_X.

In step S20, the inspection device 40 counts up a counter k by 1. The counter k is used to discriminate the battery monitoring devices BM1 to BM4 from each other, and has an initial value of 0. In other words, if the process in step S20 is performed for the first time, k=0 is counted up by 1 and thus becomes k=1. Thereafter, a value of the counter k is counted up by 1 when the process in step S20 is repeatedly performed.

In step S30, the inspection device 40 reads a unique ID of a k-th battery monitoring device among the battery monitoring devices BM1 to BM4 by using the value of the counter k counted up in the previous step S20. At this time, the inspection device 40 may read the unique ID in the same method as in step S10 described above. In other words, for example, a two-dimensional code of a unique ID is written on the package surface or the like of each of the battery monitoring devices BM1 to BM4, and the code of the k-th battery monitoring device is read by the two-dimensional code scanner 41, so that the inspection device 40 reads the unique ID. Alternatively, the inspection device 40 and the k-th battery monitoring device may be connected to each other in a wired manner or in a near field communication manner using infrared rays, and then the inspection device 40 may read the unique ID. In addition, a user may input the unique ID of the k-th battery monitoring device to the inspection device 40, so that the inspection device 40 acquires the unique ID.

In step S40, the inspection device 40 starts wireless communication with the k-th battery monitoring device of which the unique ID is read in the previous step S30. At this time, the inspection device 40 specifies the battery monitoring device which is a communication destination by using the unique ID read in step S30. In addition, as described above, in a case where the inspection device 40 and the battery monitoring device are connected to each other in a wired manner or in a near field communication manner, and the inspection device 40 reads the unique ID in step S30, a process in step S40 may be omitted.

In step S50, the inspection device 40 assigns an address k, that is, a k-th address to the k-th battery monitoring device which starts the communication in step S40. A value of the address assigned in this way is stored and held in the battery monitoring device along with its unique ID.

In step S60, the inspection device 40 notifies the k-th battery monitoring device to which the address k is assigned in step S50, of the unique ID_X of the microcomputer 30 which is a host controller. The unique ID_X is a value read in step S10 described above. The value of the unique ID_X of which, the notification has been sent here is stored and held in the battery monitoring device as a unique ID of a communication destination.

In step S70, the inspection device 40 determines whether or not a value of the counter k is the same as a predetermined upper limit value N. If the value of the counter k has not reached the upper limit value N yet, the flow returns to step S20, and if the value of the counter k has reached the upper limit value N, the flow proceeds to step S80. The upper limit value N is set in accordance with the number of battery monitoring devices connected to the battery module 9. In other words, in the present embodiment, the four battery monitoring devices BM1 to BM4 are connected to the battery module 9, and thus N is 4. In addition, the user may set the upper limit value N in the inspection device 40 in advance. Alternatively, the user himself/herself may perform the determination in step S70.

As described above, the processes in steps S20 to S70 are repeatedly performed until k reaches N from k=1, and thus the inspection device 40 sequentially performs reading of a unique ID and assignment of an address with respect to the respective battery monitoring devices BM1 to BM4. An order of the processes is determined in accordance with an order of potentials of cell groups to which the respective battery monitoring devices BM1 to BM4 are connected in the battery module 9.

In other words, the inspection device 40 initially sets k=1 as a value of the counter k, and, accordingly, reads the unique ID_A of the first battery monitoring device BM1 and assigns the address 1 to the battery monitoring device BM1. Next, the counter k is counted up by 1 so as to become k=2, and, accordingly, the unique ID_B of the second battery monitoring device BM2 is read and the address 2 is assigned to the battery monitoring device BM2. Subsequently, the counter k is counted up by 1 so as to become k=3, and, accordingly, the unique ID_C of the third battery monitoring device BM3 is read and the address 3 is assigned to the battery monitoring device BM3. In addition, the counter k is counted up by 1 so as to become k=4, and, accordingly, the unique ID_D of the fourth battery monitoring device BM4 is read and the address 4 is assigned to the battery monitoring device BM4.

In step S80, the inspection device 40 starts wireless communication with the microcomputer 30 which is a host controller. At this time, the inspection device 40 specifies the microcomputer 30 as a communication partner by using the unique ID_X of the microcomputer 30 read in step S10.

In step S90, the inspection device 40 reports the unique IDs of the respective battery monitoring devices BM1 to BM4 read in step S30 and the addresses assigned to the respective battery monitoring devices BM1 to BM4 in step S50, to the microcomputer 30 as a host controller which starts the communication in step S80. At this time, the inspection device 40 transmits ID_A to ID_D of the respective battery monitoring devices BM1 to BM4 and the addresses 1 to 4 to the microcomputer 30 in correlation with each other for each battery monitoring device. The microcomputer 30 stores a correspondence list indicating a correspondence relationship between the addresses assigned to the respective battery monitoring devices BM1 to BM4 and the unique IDs thereof in the above-described storage region 30A on the basis of the unique IDs and the addresses of the respective battery monitoring devices BM1 to BM4 transmitted from the inspection device 40.

If step S90 is completed, the inspection device 40 finishes the process illustrated in the flowchart of FIG. 6.

The above-described address assignment process is performed, and, thus, as illustrated in FIG. 5, the addresses 1 to 4 which are respectively assigned to the battery monitoring devices BM1 to BM4 and the unique ID_X of the microcomputer 30 which is a host controller are respectively stored therein. The battery monitoring devices BM1 to BM4 perform wireless communication with the microcomputer 30 on the basis of this information.

In addition, a correspondence relationship between the addresses 1 to 4 and the unique ID_A to ID_D is stored in the storage region 30A of the microcomputer 30. The microcomputer 30 discriminates the addresses assigned to the respective battery monitoring devices BM1 to BM4 from each other on the basis of the correspondence relationship, and performs wireless communication with the battery monitoring devices BM1 to BM4.

According to the first embodiment of the present invention described above, the following operation and effect are achieved.

(1) The inspection device 40 sequentially performs, on the battery monitoring devices BM1 to BM4, the process (step S30) for reading the unique IDs thereof and the process (step S50) for assigning the addresses in an order of potentials of the cell groups in the battery module 9, to which the battery monitoring devices BM1 to BM4 are connected. Then, the unique IDs of the respective battery monitoring devices BM1 to BM4 read in step S30 and the addresses of the respective battery monitoring devices BM1 to BM4 assigned in step S50 are transmitted to the microcomputer 30 which is a host controller in correlation with each other for each battery monitoring device (step S90). The microcomputer 30 stores a correspondence relationship between the unique IDs and the addresses for the respective battery monitoring devices BM1 to BM4 in the storage region 30A on the basis of the unique IDs and the addresses of the battery monitoring devices BM1 to BM4 transmitted from the inspection device 40 in step S90. With this configuration, the microcomputer 30 which is a host controller can properly identify the information from the respective battery monitoring devices BM1 to BM4.

Second Embodiment

Figure 7:
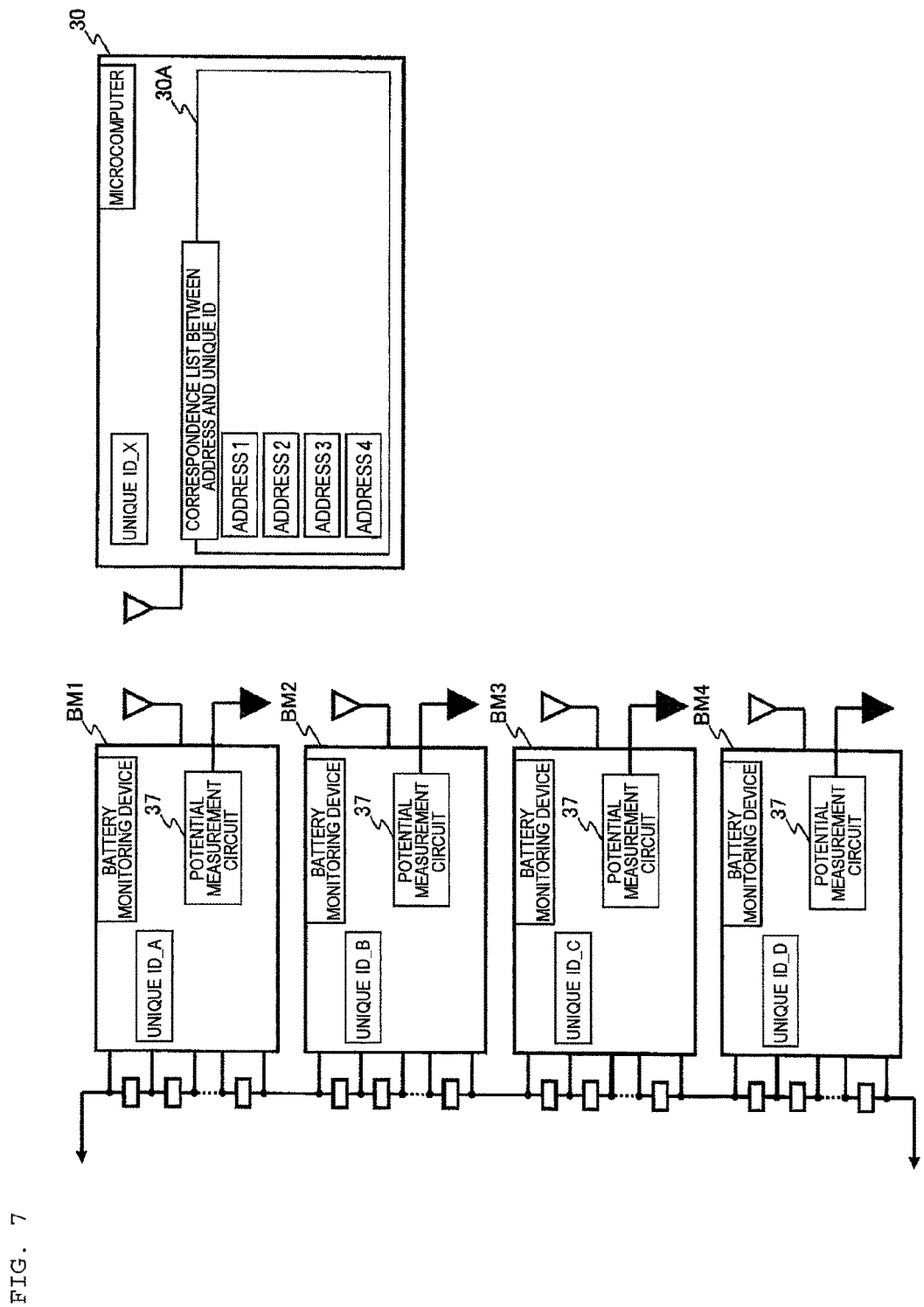
FIG. 7 is a diagram illustrating a schematic configuration of a battery monitoring system according to a second embodiment.

FIG. 7 is a diagram illustrating a schematic configuration of a battery monitoring system according to a second embodiment of the present invention. In this schematic configuration diagram, in the same manner as in the above-described first embodiment, a part whose description is not necessary is not illustrated as compared with the battery monitoring system 100 of FIG. 1.

In FIG. 7, a potential measurement circuit 37 is provided in each of the battery monitoring devices BM1 to BM4. The potential measurement circuit 37 measures a potential of each of the battery monitoring devices BM1 to BM4 relative to GND of the vehicle, that is, a potential of the cell group in the battery module 9, to which each of the battery monitoring devices BM1 to BM4 is connected. In addition, the battery monitoring devices BM1 to BM4 are connected to the battery module 9 in an order from a cell group on a higher potential side to a cell group on a lower potential side. For this reason, the potential measurement circuits 37 measure potentials which decrease in an order of the battery monitoring devices BM1 to BM4.

In the present embodiment, addresses corresponding to the number of the battery monitoring devices connected to the battery module 9 are stored in the storage region 30A of the microcomputer 30 in advance. In other words, in the present embodiment, the four battery monitoring devices BM1 to BM4 are connected to the battery module 9, and thus the addresses 1 to 4 are stored in the storage region 30A in advance as illustrated in FIG. 7.

Figure 8:
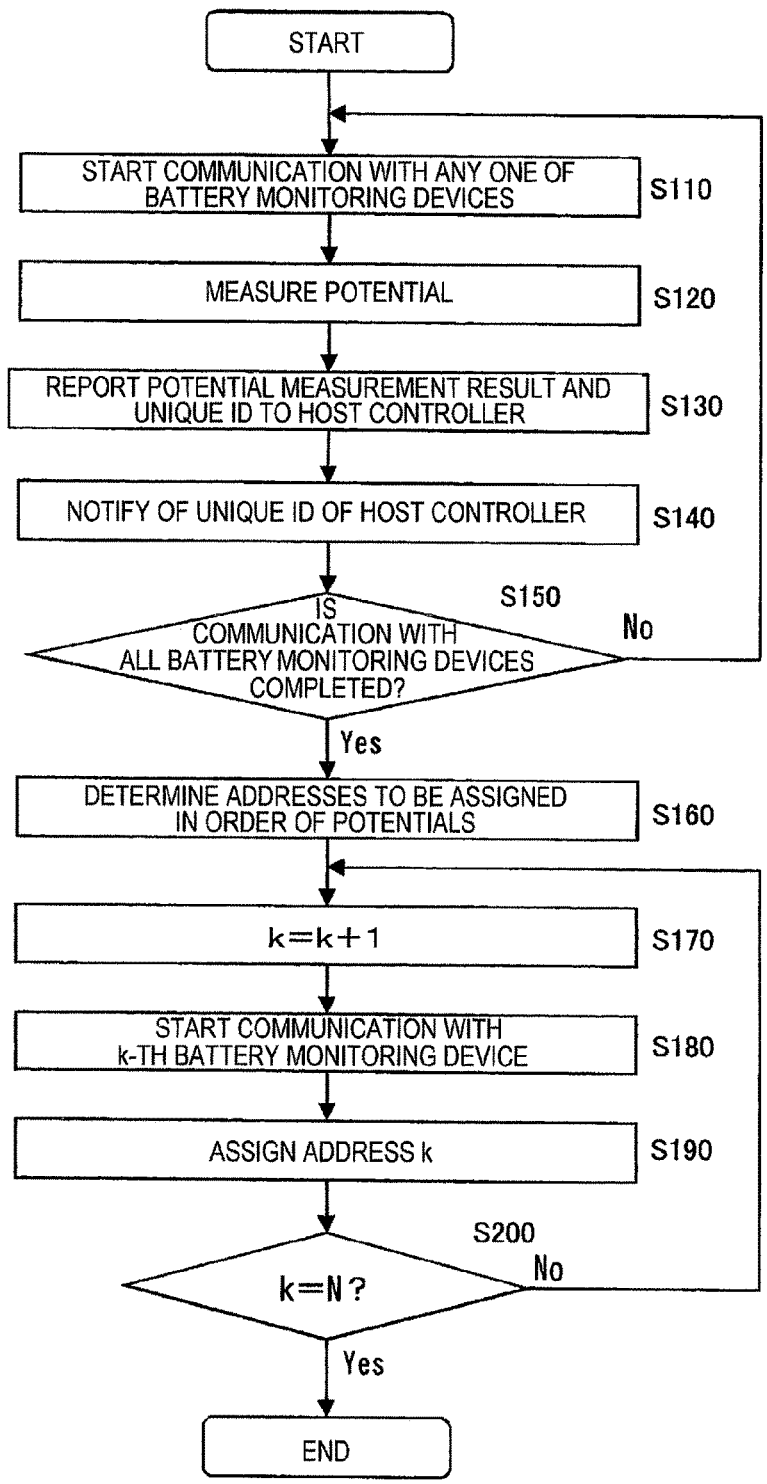
FIG. 8 is a flowchart illustrating procedures of an address assignment process according to the second embodiment.

FIG. 8 is a flowchart illustrating procedures of an address assignment process according to the second embodiment.

In step S110, the microcomputer 30 selects any one of the battery monitoring devices BM1 to BM4, and starts wireless communication with the selected battery monitoring device. At this time, the microcomputer 30 selects a battery monitoring device which has not communicated with the microcomputer 30 among the battery monitoring devices BM1 to BM4. For example, inquiry about whether or not communication is completed is made to the battery monitoring devices BM1 to BM4, and a battery monitoring device which makes a first response of communication not having been performed to this inquiry is selected, so that wireless communication is started therewith. In addition, any selection method may be used as long as a battery monitoring device which has not communicated is properly selected among the battery monitoring devices BM1 to BM4.

In step S120, among the battery monitoring devices BM1 to BM4, the battery monitoring device which starts communication in step S110 and is in communication with the microcomputer 30 measures a potential relative to GND of the vehicle. That is, the potential measurement circuit 37 measures a potential of the cell group in the battery module 9, to which the battery monitoring device is connected.

In step S130, the battery monitoring device which is in communication with the microcomputer 30 transmits a result of the potential measurement performed in step S120 and the unique ID which is preliminarily set therein to the microcomputer 30 which is a host controller, thereby performing a report thereon.

When the report on the potential measurement result and the unique ID is received from any one of the battery monitoring devices BM1 to BM4 in step S130, the microcomputer 30 as a host controller notifies the battery monitoring device of its unique ID_X in subsequent step S140. The value of the unique ID_X of which the notification has been sent here is stored and held in the corresponding battery monitoring device as a unique ID of a communication destination.

In step S150, the microcomputer 30 determines whether or not communication with all the battery monitoring devices is completed. In a case where a battery monitoring device which has not communicated remains among the battery monitoring devices BM1 to BM4, the flow returns to step S110, and in a case where communication with all the battery monitoring devices BM1 to BM4 is completed, the flow proceeds to step S160. This determination may be performed by making the same inquiry as in step S110 of the battery monitoring devices BM1 to BM4 and by checking whether or not a response of communication not having been performed is made to the inquiry from any one of the battery monitoring devices. Alternatively, the number of times in which the processes in steps S110 to S140 described above have been performed hitherto may be compared with the number of addresses which is preliminarily stored in the storage region 30A, and the determination in step S150 may be performed depending on whether or not they match each other.

The processes in steps S110 to S150 are repeatedly performed until communication with all the battery monitoring devices BM1 to BM4 is completed in the above-described way, and thus the microcomputer 30 acquires the potential measurement results and the unique ID_A to ID_D of the respective battery monitoring devices BM1 to BM4.

In step S160, the microcomputer 30 determines addresses to be assigned to the battery monitoring devices BM1 to BM4 in an order of the measured potentials on the basis of the potential measurement results and the unique IDs of the battery monitoring devices BM1 to BM4 reported from the battery monitoring devices BM1 to BM4 in step S130. In other words, since the potential measurement circuits 37 measure potentials which decrease in an order of the battery monitoring devices BM1 to BM4 as described above, the addresses 1 to 4 are assigned to the battery monitoring devices BM1 to BM4 and are set as addresses thereof. If the assigned addresses of the respective battery monitoring devices BM1 to BM4 are determined in this way, the microcomputer 30 stores a correspondence list indicating a correspondence relationship between the assigned addresses and the unique IDs in the storage region 30A.

In step S170, the microcomputer 30 counts up a counter k by 1. The counter k is the same as that described in the first embodiment, and has an initial value of 0. In other words, if the process in step S170 is performed for the first time, k=0 is counted up by 1 and thus becomes k=1. Thereafter, a value of the counter k is counted up by 1 when the process in step S170 is repeatedly performed.

In step S180, the microcomputer 30 starts wireless communication with a k-th battery monitoring device among the battery monitoring devices BM1 to BM4 by using the value of the counter k counted up in the previous step S170. At this time, the microcomputer 30 discriminates a unique ID of the battery monitoring device which is a communication destination on the basis of the correspondence relationship between the assigned addresses and the unique IDs stored in the storage region 30A in step S160, and specifies the battery monitoring device by using the unique ID.

In step S190, the microcomputer 30 assigns an address k, that is, a k-th address to the k-th battery monitoring device with which the communication is started in step S180. A value of the address assigned in this way is stored and held in the battery monitoring device along with its unique ID.

In step S200, the microcomputer 30 determines whether or not a value of the counter k is the same as a predetermined upper limit value N. If the value of the counter k has not reached the upper limit value N yet, the flow returns to step S170, and if the value of the counter k has reached the upper limit value N, the process illustrated in the flowchart of FIG. 8 finishes. The upper limit value N is set in accordance with the number of battery monitoring devices connected to the battery module 9, and corresponds to the number of addresses stored in the storage region 30A in advance as described above. In other words, in the present embodiment, the four battery monitoring devices BM1 to BM4 are connected to the battery module 9, and thus N is 4.

As described above, the processes in steps S170 to S200 are repeatedly performed until k reaches N from k=1, and thus the microcomputer 30 sequentially assigns addresses to the respective battery monitoring devices BM1 to BM4 so as to assign the addresses 1 to 4 thereto.

The above-described address assignment process is performed, and, thus, in the same manner as in the first embodiment, the addresses 1 to 4 which are respectively assigned to the battery monitoring devices BM1 to BM4 and the unique ID_X of the microcomputer 30 which is a host controller are respectively stored therein. The battery monitoring devices BM1 to BM4 perform wireless communication with the microcomputer 30 on the basis of this information. In addition, a correspondence relationship between the addresses 1 to 4 and the unique ID_A to ID_D is stored in the storage region 30A of the microcomputer 30. The microcomputer 30 discriminates the addresses assigned to the respective battery monitoring devices BM1 to BM4 from each other on the basis of the correspondence relationship, and performs wireless communication with the battery monitoring devices BM1 to BM4.

According to the second embodiment of the present invention described above, the following operation and effect are achieved.

(2) The battery monitoring devices BM1 to BM4 respectively include the potential measurement circuits 37 which measure potentials of the connected cell groups in the battery module 9, and transmit potentials measured thereby and the unique IDs to the microcomputer 30 which is a host controller (step S130). The microcomputer 30 determines a correspondence relationship between the unique IDs and the addresses of the respective battery monitoring devices BM1 to BM4 on the basis of the potentials and the unique IDs transmitted from the battery monitoring devices BM1 to BM4 in step S130, and stores the correspondence relationship in the storage region 30A (step S160). With this configuration, in the same manner as in the first embodiment, the microcomputer 30 which is a host controller can properly identify the information from the respective battery monitoring devices BM1 to BM4.

Third Embodiment

Figure 9:
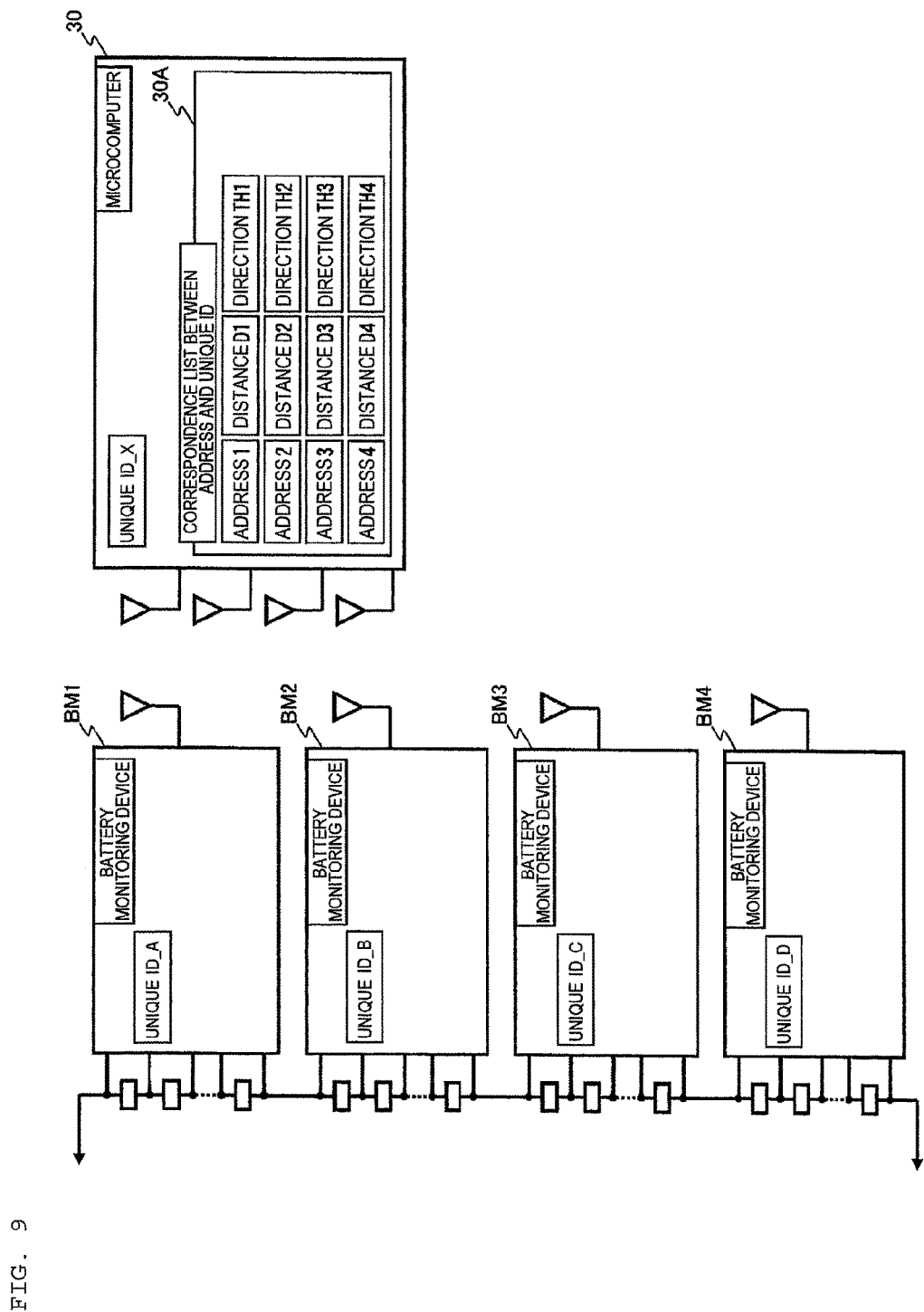
FIG. 9 is a diagram illustrating a schematic configuration of a battery monitoring system according to a third embodiment.

FIG. 9 is a diagram illustrating a schematic configuration of a battery monitoring system according to a third embodiment of the present invention. In this schematic configuration diagram, in the same manner as in the above-described first and second embodiments, a part whose description is not necessary is not illustrated as compared with the battery monitoring system 100 of FIG. 1.

In the present embodiment, addresses corresponding to the number of battery monitoring devices connected to the battery module 9, and distances and directions from the microcomputer 30 corresponding to the respective addresses are stored in the storage region 30A of the microcomputer 30 in advance. In other words, in the present embodiment, since four battery monitoring devices BM1 to BM4 are connected to the battery module 9, as illustrated in FIG. 9, addresses 1 to 4, distances D1 to D4, and directions TH1 to TH4 are stored in the storage region 30A in advance. In addition, values of the distances D1 to D4 and the directions TH1 to TH4 may be determined from a positional relationship between the microcomputer 30 and the respective battery monitoring devices BM1 to BM4 when the battery monitoring devices BM1 to BM4 are incorporated into the battery monitoring system 100 and are connected to the respective cell groups of the battery module 9.

Figure 10:
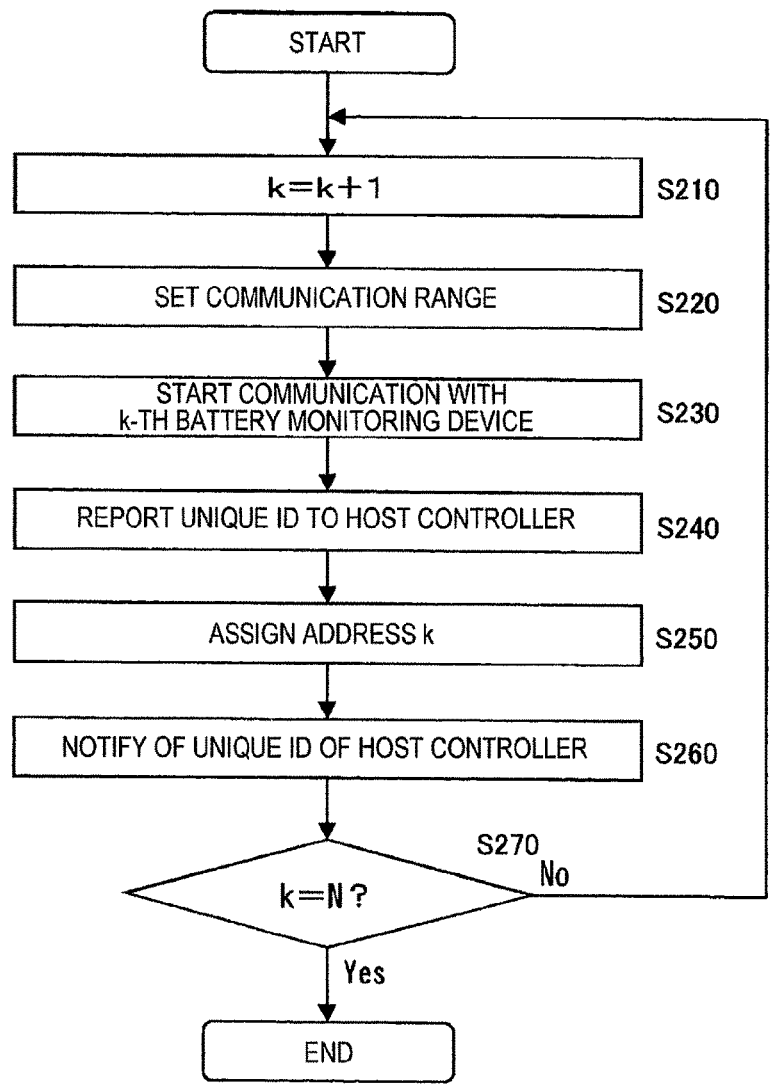
FIG. 10 is a flowchart illustrating procedures of an address assignment process according to the third embodiment.

FIG. 10 is a flowchart illustrating procedures of an address assignment process according to the third embodiment.

In step S210, the microcomputer 30 counts up a counter k by 1. The counter k is the same as that described in the first and second embodiments, and has an initial value of 0. In other words, if the process in step S210 is performed for the first time, k=0 is counted up by 1 and thus becomes k=1. Thereafter, a value of the counter k is counted up by 1 when the process in step S210 is repeatedly performed.

In step S220, the microcomputer 30 sets a communication range for a k-th battery monitoring device among the battery monitoring devices BM1 to BM4 by using the value of the counter k counted up in the previous step S210. At this time, the microcomputer 30 selects a distance and a direction corresponding to an address of the k-th battery monitoring device among the distances and the directions which are stored in the storage region 30A so as to correspond to the respective addresses, and adjusts a gain or a phase of an antenna so that a transmission range of a wireless signal matches the distance and the direction thereof. In other words, the wireless signal transmitted from the wireless communication portion RF is adjusted so that only the k-th battery monitoring device is in the communication range, and the other battery monitoring devices are out of the communication range.

In step S230, the microcomputer 30 starts wireless communication with the k-th battery monitoring device among the battery monitoring devices BM1 to BM4 on the basis of the communication range set in the previous step S220. In addition, at this time, the other battery monitoring devices are out of the communication range set in step S220, and thus can be excluded from wireless communication targets. Accordingly, the microcomputer 30 can perform the wireless communication only with the k-th battery monitoring device.

In step S240, among the battery monitoring devices BM1 to BM4, the k-th battery monitoring device which starts communication in step S230 and is in communication with the microcomputer 30 transmits the unique ID which is preliminarily set therein to the microcomputer 30 which is a host controller, thereby performing a report on the unique ID.

When the report on the unique ID is received from the k-th battery monitoring device in step S240, the microcomputer 30 assigns an address k, that is, a k-th address to the battery monitoring device in subsequent step S250. A value of the address assigned in this way is stored and held in the battery monitoring device along with its unique ID.

In step S260, the microcomputer 30 notifies the k-th battery monitoring device to which the address k is assigned in step S250, of the unique ID_X of the microcomputer 30 which is a host controller. The value of the unique ID_X of which the notification has been sent here is stored and held in the corresponding battery monitoring device as a unique ID of a communication destination.

In step S270, the microcomputer 30 determines whether or not a value of the counter k is the same as a predetermined upper limit value N. If the value of the counter k has not reached the upper limit value N yet, the flow returns to step S210, and if the value of the counter k has reached the upper limit value N, the process illustrated in the flowchart of FIG. 10 finishes. The upper limit value N is set in accordance with the number of battery monitoring devices connected to the battery module 9, and corresponds to the number of addresses stored in the storage region 30A in advance as described above. In other words, in the present embodiment, the four battery monitoring devices BM1 to BM4 are connected to the battery module 9, and thus N is 4.

As described above, the processes in steps S210 to S270 are repeatedly performed until k reaches N from k=1, and thus the microcomputer 30 sequentially sets communication ranges in an order of potentials of the cell groups in the battery module 9, to which the respective battery monitoring devices BM1 to BM4 are connected, and sequentially performs wireless communication with the battery monitoring devices BM1 to BM4 in the communication ranges. Accordingly, the unique ID_A to ID_D of the respective battery monitoring devices BM1 to BM4 are acquired, and the addresses are sequentially assigned to the respective battery monitoring devices BM1 to BM4 so that the addresses 1 to 4 are respectively assigned thereto. In addition, a correspondence relationship between the assigned addresses and the unique IDs of the battery monitoring devices BM1 to BM4 is determined, and a correspondence list indicating the correspondence relationship is stored in the storage region 30A.

The above-described address assignment process is performed, and, thus, in the same manner as in the first and second embodiments, the addresses 1 to 4 which are respectively assigned to the battery monitoring devices BM1 to BM4 and the unique ID_X of the microcomputer 30 which is a host controller are respectively stored therein. The battery monitoring devices BM1 to BM4 perform wireless communication with the microcomputer 30 on the basis of this information. In addition, a correspondence relationship between the addresses 1 to 4 and the unique ID_A to ID_D is stored in the storage region 30A of the microcomputer 30. The microcomputer 30 discriminates the addresses assigned to the respective battery monitoring devices BM1 to BM4 from each other on the basis of the correspondence relationship, and performs wireless communication with the battery monitoring devices BM1 to BM4.

According to the third embodiment of the present invention described above, the following operation and effect are achieved.

(3) The microcomputer 30 which is a host controller of the battery monitoring devices BM1 to BM4 sequentially sets communication ranges for performing wireless communication with the battery monitoring devices BM1 to BM4 in an order of potentials of the cell groups in the battery module 9, to which the battery monitoring devices BM1 to BM4 are connected, on the basis of information on the distances and the directions set in advance (step S220). The battery monitoring devices BM1 to BM4 sequentially transmit their unique IDs to the microcomputer 30 in the order of potentials in accordance with the communication ranges set in step S220 (step S240). The microcomputer 30 determines a correspondence relationship between the unique IDs and the addresses of the respective battery monitoring devices BM1 to BM4 on the basis of the unique IDs which are sequentially transmitted from the battery monitoring devices BM1 to BM4 in the order of potentials in this way, and stores the correspondence relationship in the storage region 30A (step S250). With this configuration, in the same manner as in the first and second embodiments, the microcomputer 30 which is a host controller can properly identify the information from the respective battery monitoring devices BM1 to BM4.

Fourth Embodiment

Figure 11:
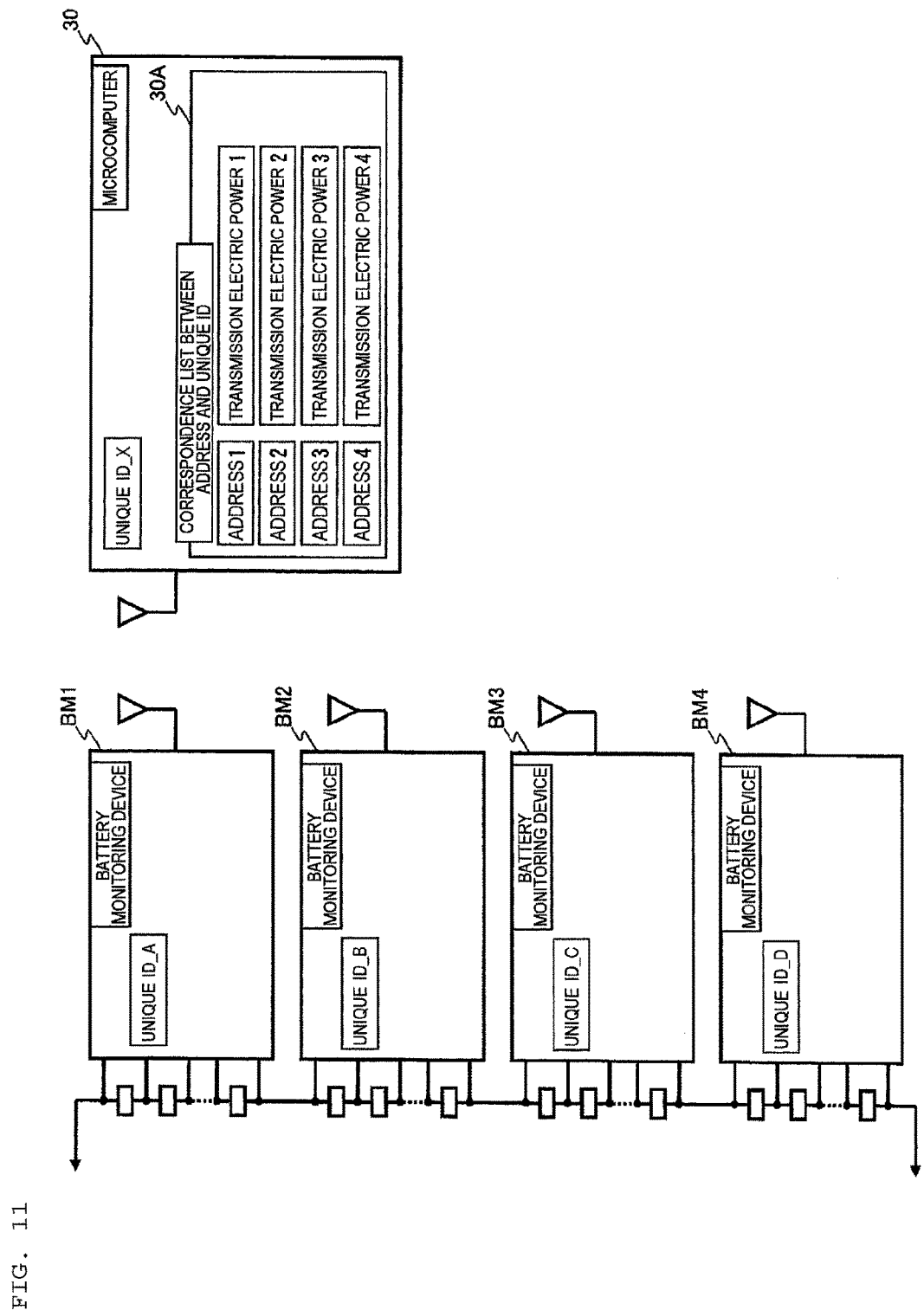
FIG. 11 is a diagram illustrating a schematic configuration of a battery monitoring system according to a fourth embodiment.

FIG. 11 is a diagram illustrating a schematic configuration of a battery monitoring system according to a fourth embodiment of the present invention. In this schematic configuration diagram, in the same manner as in the above-described first to third embodiments, a part whose description is not necessary is not illustrated as compared with the battery monitoring system 100 of FIG. 1.

In the present embodiment, addresses corresponding to the number of battery monitoring devices connected to the battery module 9, and transmission electric powers corresponding to the respective addresses are stored in the storage region 30A of the microcomputer 30 in advance. In other words, in the present embodiment, since four battery monitoring devices BM1 to BM4 are connected to the battery module 9, as illustrated in FIG. 11, addresses 1 to 4 and transmission electric powers 1 to 4 are stored in the storage region 30A in advance. In addition, values of the transmission electric powers 1 to 4 may be determined from a gain of the antenna in the wireless communication portion RF, or a distance between the microcomputer 30 and the respective battery monitoring devices BM1 to BM4 when the battery monitoring devices BM1 to BM4 are incorporated into the battery monitoring system 100 and are connected to the respective cell groups of the battery module 9.

Figure 12:
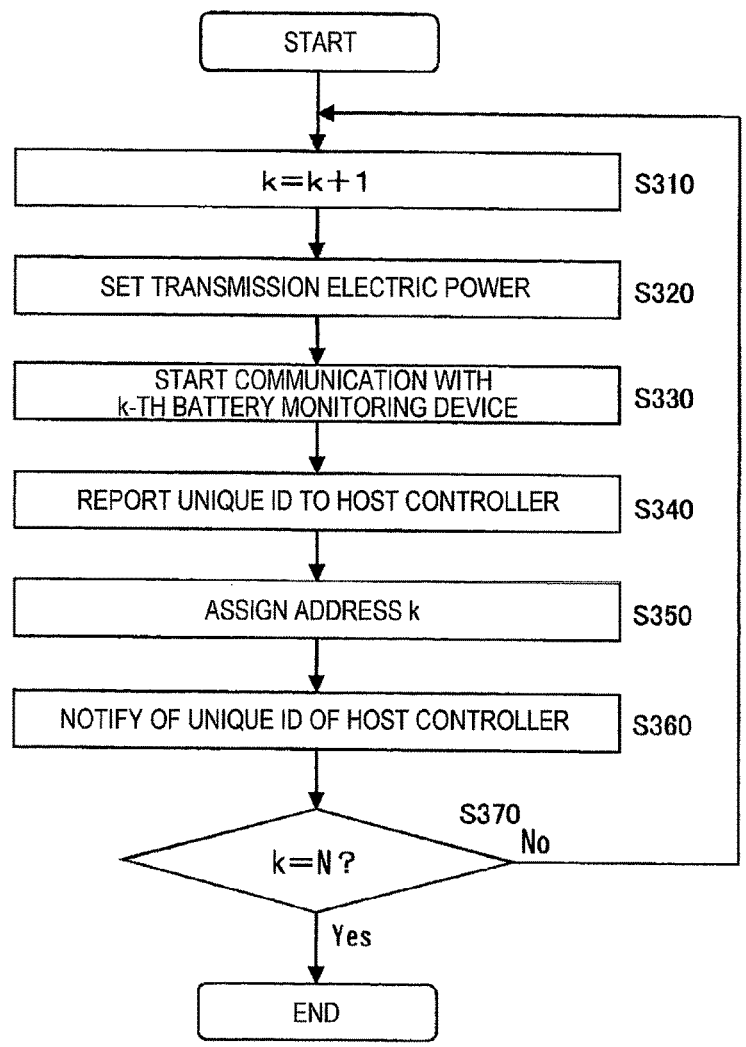
FIG. 12 is a flowchart illustrating procedures of an address assignment process according to the fourth embodiment.

FIG. 12 is a flowchart illustrating procedures of an address assignment process according to the fourth embodiment.

In step S310, the microcomputer 30 counts up a counter k by 1. The counter k is the same as that described in the first to third embodiments, and has an initial value of 0. In other words, if the process in step S310 is performed for the first time, k=0 is counted up by 1 and thus becomes k=1. Thereafter, a value of the counter k is counted up by 1 when the process in step S310 is repeatedly performed.

In step S320, the microcomputer 30 sets a transmission electric power for a k-th battery monitoring device among the battery monitoring devices BM1 to BM4 by using the value of the counter k counted up in the previous step S310. At this time, the microcomputer 30 selects a transmission electric power corresponding to an address of the k-th battery monitoring device among the transmission electric powers which are stored in the storage region 30A so as to correspond to the respective addresses, and adjusts a transmission electric power of the wireless communication portion RF to match the transmission electric power. In other words, the transmission electric power of the wireless signal transmitted from the wireless communication portion RF is adjusted so that battery monitoring devices up to the k-th battery monitoring device are in a communication range, and (k+1)-th and subsequent battery monitoring devices are out of the communication range.

In step S330, the microcomputer 30 transmits the wireless signal with the transmission electric power set in the previous step S320 so as to start wireless communication with the k-th battery monitoring device among the battery monitoring devices BM1 to BM4. In addition, at this time, the battery monitoring devices up to the (k−1)-th battery monitoring device which have already performed communication do not respond even if the wireless signal from the microcomputer 30 is received, and are thus excluded from wireless communication targets. On the other hand, the (k+1)-th and subsequent battery monitoring devices which have not performed communication are out of the communication range due to the transmission electric power set in step S320, and thus can be excluded from wireless communication targets. Accordingly, the microcomputer 30 can perform the wireless communication only with the k-th battery monitoring device.

In step S340, among the battery monitoring devices BM1 to BM4, the k-th battery monitoring device which starts communication in step S330 and is in communication with the microcomputer 30 transmits the unique ID which is preliminarily set therein to the microcomputer 30 which is a host controller, thereby performing a report on the unique ID.

When the report on the unique ID is received from the k-th battery monitoring device in step 3340, the microcomputer 30 assigns an address k, that is, a k-th address to the battery monitoring device in subsequent step S350. A value of the address assigned in this way is stored and held in the battery monitoring device along with its unique ID.

In step S360, the microcomputer 30 notifies the k-th battery monitoring device to which the address k is assigned in step S350, of the unique ID_X of the microcomputer 30 which is a host controller. The value of the unique ID_X of which the notification has been sent here is stored and held in the corresponding battery monitoring device as a unique ID of a communication destination.

In step S370, the microcomputer 30 determines whether or not a value of the counter k is the same as a predetermined upper limit value N. If the value of the counter k has not reached the upper limit value N yet, the flow returns to step S310, and if the value of the counter k has reached the upper limit value N, the process illustrated in the flowchart of FIG. 12 finishes. The upper limit value N is set in accordance with the number of battery monitoring devices connected to the battery module 9, and corresponds to the number of addresses stored in the storage region 30A in advance as described above. In other words, in the present embodiment, the four battery monitoring devices BM1 to BM4 are connected to the battery module 9, and thus N is 4.

As described above, the processes in steps S310 to S370 are repeatedly performed until k reaches N from k=1, and thus the microcomputer 30 sequentially sets transmission electric powers in an order of potentials of the cell groups in the battery module 9, to which the respective battery monitoring devices BM1 to BM4 are connected, and sequentially performs wireless communication with the battery monitoring devices BM1 to BM4 with the transmission electric powers. Accordingly, the unique ID_A to ID_D of the respective battery monitoring devices BM1 to BM4 are acquired, and the addresses are sequentially assigned to the respective battery monitoring devices BM1 to BM4 so that the addresses 1 to 4 are respectively assigned thereto. In addition, a correspondence relationship between the assigned addresses and the unique IDs of the battery monitoring devices BM1 to BM4 is determined, and a correspondence list indicating the correspondence relationship is stored in the storage region 30A.

The above-described address assignment process is performed, and, thus, in the same manner as in the first to third embodiments, the addresses 1 to 4 which are respectively assigned to the battery monitoring devices BM1 to BM4 and the unique ID_X of the microcomputer 30 which is a host controller are respectively stored therein. The battery monitoring devices BM1 to BM4 perform wireless communication with the microcomputer 30 on the basis of this information. In addition, a correspondence relationship between the addresses 1 to 4 and the unique ID_A to ID_D is stored in the storage region 30A of the microcomputer 30. The microcomputer 30 discriminates the addresses assigned to the respective battery monitoring devices BM1 to BM4 from each other on the basis of the correspondence relationship, and performs wireless communication with the battery monitoring devices BM1 to BM4.

In addition, in the address assignment process according to the above-described fourth embodiment, an antenna gain may be set instead of the transmission electric power. In other words, addresses corresponding to the number of battery monitoring devices connected to the battery module 9, and antenna gains corresponding to the respective addresses are stored in the storage region 30A of the microcomputer 30 in advance. In step S320 of FIG. 12, the microcomputer 30 sets an antenna gain for a k-th battery monitoring device among the battery monitoring devices BM1 to BM4 by using the value of the counter k counted up in the previous step S310. At this time, the microcomputer 30 selects an antenna gain corresponding to an address of the k-th battery monitoring device among the antenna gains which are stored in the storage region 30A so as to correspond to the respective addresses, and adjusts an antenna gain of the wireless communication portion RF to match the antenna gain. Even in this way, in the same manner as in a case of adjusting the transmission electric power, the transmission electric power of the wireless signal transmitted from the wireless communication portion RF can be adjusted so that battery monitoring devices up to the k-th battery monitoring device are in a communication range, and (k+1)-th and subsequent battery monitoring devices are out of the communication range.

According to the fourth embodiment of the present invention described above, the following operation and effect are achieved.

(4) The microcomputer 30 which is a host controller of the battery monitoring devices BM1 to BM4 sequentially sets transmission electric powers or antenna gains for performing wireless communication with the battery monitoring devices BM1 to BM4 in an order of potentials of the cell groups in the battery module 9, to which the battery monitoring devices BM1 to BM4 are connected, on the basis of information on the transmission electric powers or the antenna gains set in advance (step S320). The battery monitoring devices BM1 to BM4 sequentially transmit their unique IDs to the microcomputer 30 in the order of potentials in accordance with the transmission electric powers or the antenna gains set in step S320 (step S340). The microcomputer 30 determines a correspondence relationship between the unique IDs and the addresses of the respective battery monitoring devices BM1 to BM4 on the basis of the unique IDs which are sequentially transmitted from the battery monitoring devices BM1 to BM4 in the order of potentials in this way, and stores the correspondence relationship in the storage region 30A (step S350). With this configuration, in the same manner as in the first to third embodiments, the microcomputer 30 which is a host controller can properly identify the information from the respective battery monitoring devices BM1 to BM4.

Fifth Embodiment

Figure 13:
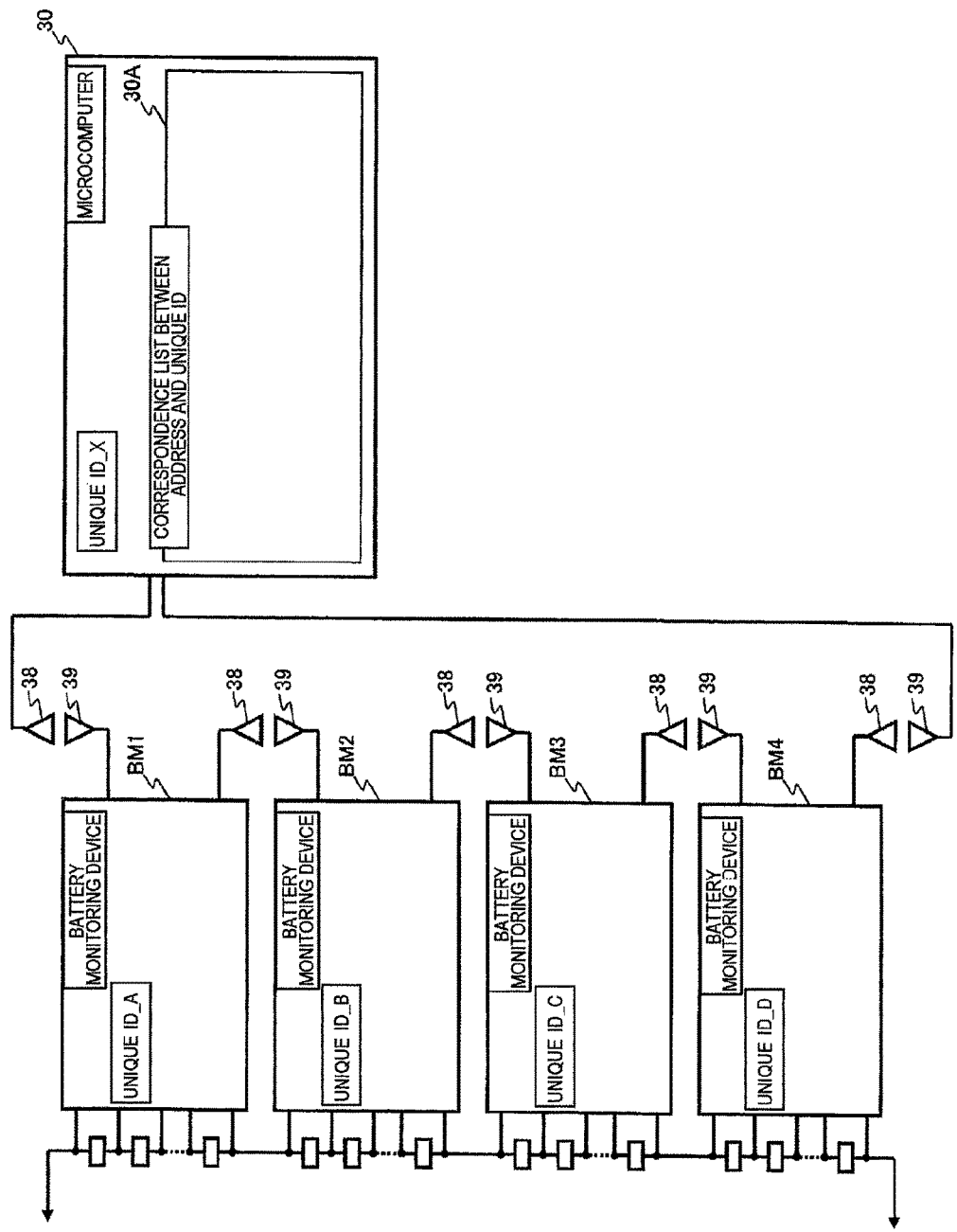
FIG. 13 is a diagram illustrating a schematic configuration of a battery monitoring system according to a fifth embodiment.

FIG. 13 is a diagram illustrating a schematic configuration of a battery monitoring system according to a fifth embodiment of the present invention. In this schematic configuration diagram, in the same manner as in the above-described first to fourth embodiments, a part whose description is not necessary is not illustrated as compared with the battery monitoring system 100 of FIG. 1.

In the present embodiment, each of the microcomputer 30 and the battery monitoring devices BM1 to BM4 includes a transmission antenna 38 and a reception antenna 39. The transmission antennas 38 of the battery monitoring devices BM1, BM2 and BM3 are respectively coupled to the reception antennas 39 of the battery monitoring devices BM2, BM3 and BM4 which are connected to one-order-lower cell groups. The transmission antenna 38 of the microcomputer 30 is coupled to the reception antenna 39 of the battery monitoring device BM1 connected to the highest-order cell group, and the transmission antenna 38 of the battery monitoring device BM4 connected to the lowest-order cell group is coupled to the reception antenna 39 of the microcomputer 30.

In the microcomputer 30 and the battery monitoring devices BM1 to BM4, a range in which wireless communication can be performed is limited to the above respective coupled antennas, and thus wireless signals are configured not to be transmitted to and received from the other antennas. In other words, a wireless signal transmitted from the transmission antenna 38 of the microcomputer 30 is received only by the reception antenna 39 of the battery monitoring device BM1. Similarly, a wireless signal transmitted from the transmission antenna 38 of the battery monitoring device BM1 is received only by the reception antenna 39 of the battery monitoring device BM2. A wireless signal transmitted from the transmission antenna 38 of the battery monitoring device BM2 is received only by the reception antenna 39 of the battery monitoring device BM3. A wireless signal transmitted from the transmission antenna 38 of the battery monitoring device BM3 is received only by the reception antenna 39 of the battery monitoring device BM4. A wireless signal transmitted from the transmission antenna 38 of the battery monitoring device BM4 is received only by the reception antenna 39 of the microcomputer 30.

Figure 14:
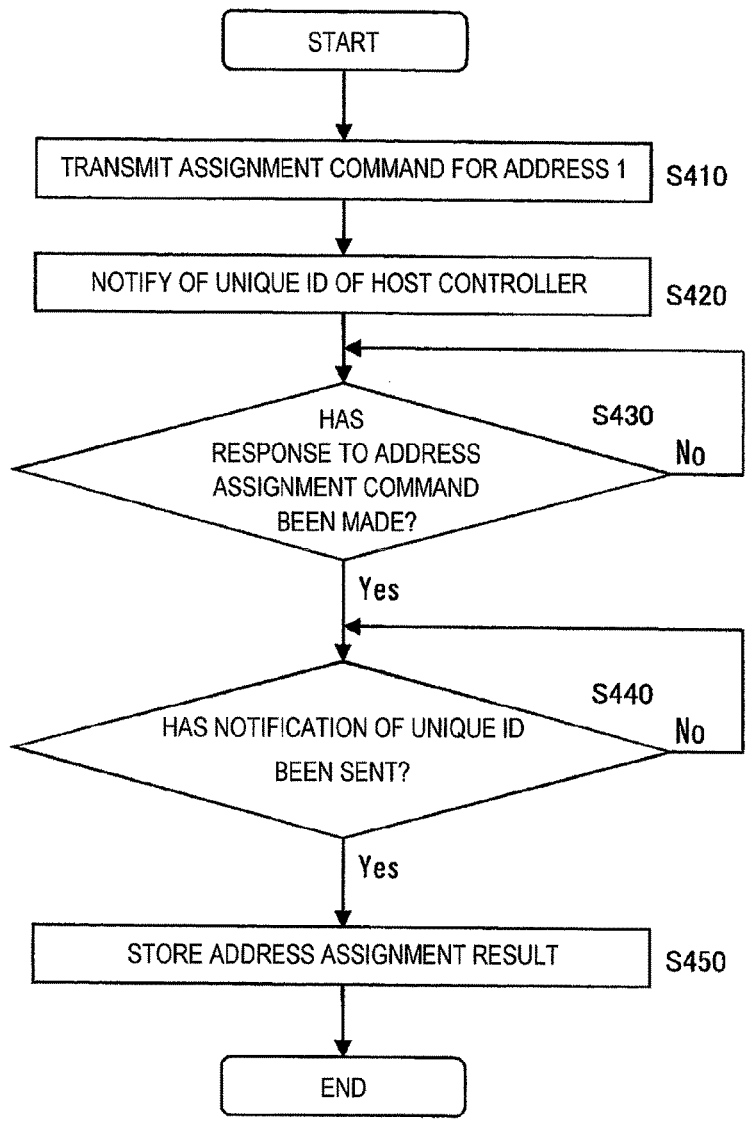
FIG. 14 is a flowchart illustrating procedures of an address assignment process according to the fifth embodiment.
Figure 15:
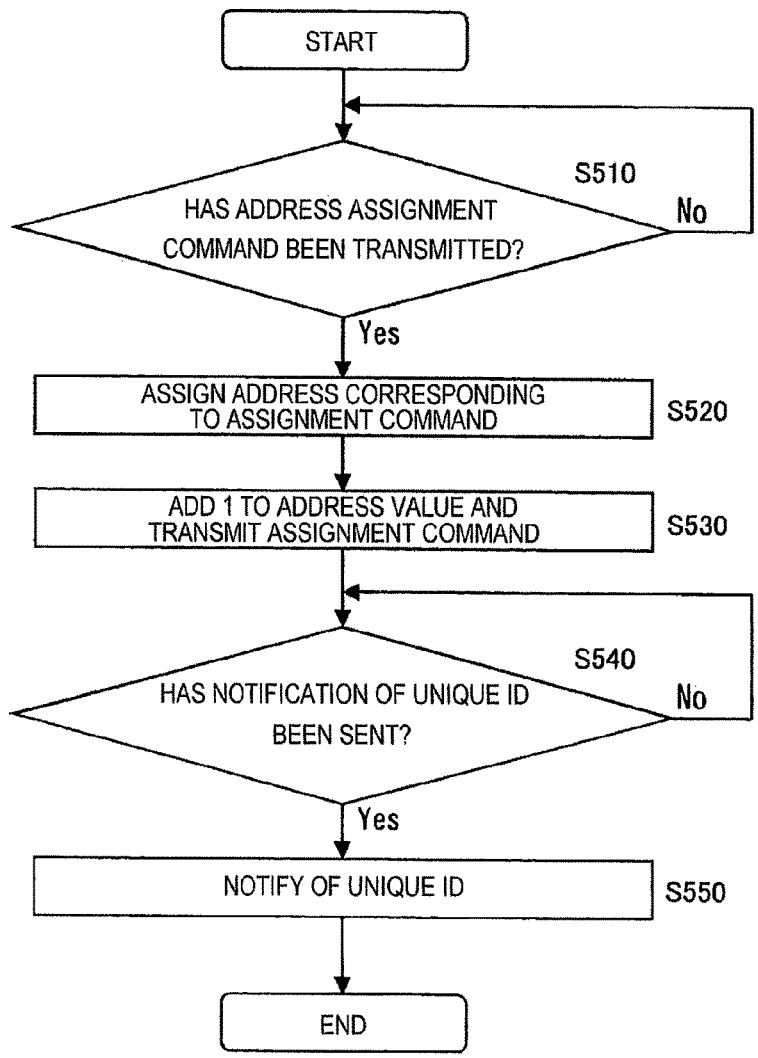
FIG. 15 is a flowchart illustrating procedures of an address assignment process according to the fifth embodiment.

FIGS. 14 and 15 are flowcharts illustrating procedures of an address assignment process according to the fifth embodiment. A process illustrated in the flowchart of FIG. 14 is performed by the microcomputer 30, and a process illustrated in the flowchart of FIG. 15 is performed by the battery monitoring devices BM1 to BM4.

In step S410, the microcomputer 30 transmits an address assignment command for an address 1 to the battery monitoring device BM1. In addition, the address assignment command is used to assign an address, and is different from the above-described command, for designating content of a monitoring operation. In other words, the address assignment command is the same as a wireless signal transmitted from the inspection device 40 or the microcomputer 30 when an address is assigned in step S50 of FIG. 5, step S190 of FIG. 8, step S250 of FIG. 10, step S350 of FIG. 12, or the like, in the first to fourth embodiments described above.

In step S420, the microcomputer 30 transmits a wireless signal from the transmission antenna 38 so as to notify the first battery monitoring device BM1 connected to the highest-order cell group, of the unique ID_X of the microcomputer 30 which is a host controller. The value of the unique ID_X of which the notification has been sent here is stored and held in the battery monitoring device BM1 as a unique ID of a communication destination.

In step S430, the microcomputer 30 determines whether or not a response to the address assignment command has been made from the battery monitoring device BM4 connected to the lowest-order cell group among the battery monitoring devices BM1 to BM4. If the response to the address assignment command has been made, the flow proceeds to the next step S440.

In step S440, the microcomputer 30 determines whether or not the battery monitoring device BM4 among the battery monitoring devices BM1 to BM4 has sent a notification of the unique ID_A to ID_D of the respective battery monitoring devices BM1 to BM4. If the battery monitoring device BM4 has sent the notification of the unique ID_A to ID_D, the flow proceeds to the next step S450.

In step S450, the microcomputer 30 stores a correspondence relationship between the addresses 1 to 4 and the unique ID_A to ID_D of the respective battery monitoring devices BM1 to BM4 received in step S440 in the storage region 30A.

If step S450 is completed, the microcomputer 30 finishes the process illustrated in the flowchart of FIG. 14.

In step S510, each of the battery monitoring devices BM1 to BM4 determines whether or not an address assignment command for any one of the addresses 1 to 4 has been transmitted from the microcomputer 30 or the battery monitoring device connected to the one-order-higher cell group. The microcomputer 30 transmits the address assignment command for the address 1 to the battery monitoring device BM1 in step S410 of FIG. 14 described above. Each of the battery monitoring devices BM1 to BM4 transmits the address assignment command by performing a process in step S530 described later. In a case where the address assignment command has been transmitted by the microcomputer 30 or the battery monitoring device connected to the one-order-higher cell group performing any one of the processes, the flow proceeds to the next step S520.

In step S520, each of the battery monitoring devices BM1 to BM4 assigns an address designated by the address assignment command thereto in response to the address assignment command transmitted in step S510. A value of the address assigned in this way is stored and held in the battery monitoring device along with its unique ID.

In step S530, each of the battery monitoring devices BM1 to BM4 adds 1 to the address value in the address assignment command transmitted in step S510, and transmits an address assignment command for an address value obtained through the addition to the battery monitoring device connected to the one-order-lower cell group or the microcomputer 30.

In step S540, each of the battery monitoring devices BM1 to BM4 determines whether or not a notification of the unique ID has been sent from the microcomputer 30 or the battery monitoring device connected to the one-order-higher cell group. The microcomputer 30 notifies the battery monitoring device BM1 of the unique ID_X in step S420 of FIG. 14 described above. Meanwhile, the battery monitoring devices BM1 to BM4 notify of the unique ID_X of the microcomputer 30 and at least one of the unique ID_A to ID_D including their unique IDs by performing a process in step S550 described later. In a case where the notification of the unique ID has been received by the microcomputer 30 or the battery monitoring device connected to the one-order-higher cell group performing any one of the processes, the flow proceeds to the next step S550. The value of the unique ID_X of the microcomputer 30 is stored and held in the corresponding battery monitoring device as a unique ID of a communication destination.

In step S550, each of the battery monitoring devices BM1 to BM4 notifies the battery monitoring device connected to the one-order-lower cell group or the microcomputer 30, of the unique IDs of the microcomputer 30 and each of the battery monitoring devices to which addresses have been assigned. Here, its own unique ID is added to the unique IDs whose notification has been sent from the microcomputer 30 or the battery monitoring device connected to the one-order-higher cell group, and a unique ID obtained through the addition is transmitted, so that the battery monitoring device connected to the one-order-lower cell group or the microcomputer 30 is notified of the unique ID.

If step S550 is completed, each of the battery monitoring devices BM1 to BM4 finishes the process illustrated in the flowchart of FIG. 15.

As described above, the microcomputer 30 performs the process of FIG. 14 so as to transmit an address assignment command for assigning the address 1 to the battery monitoring device BM1 connected to the highest-order cell group among the battery monitoring devices BM1 to BM4. When the address assignment command is received, the battery monitoring device BM1 performs the process of FIG. 15 so as to assign the address 1 thereto. In the same manner for the battery monitoring devices BM2 to BM4, when address assignment commands are received from the battery monitoring devices connected to the one-order-higher cell groups, addresses corresponding thereto are assigned to the devices. When a notification of the unique ID_A to unique ID_D of the respective battery monitoring devices BM1 to BM4 is received from the battery monitoring device BM4 connected to the lowest-order cell group, the microcomputer 30 stores a correspondence list indicating the correspondence relationship between the assigned addresses and the unique IDs of the respective battery monitoring devices BM1 to BM4 in the storage region 30A on the basis thereof.

The above-described address assignment process is performed, and, thus, in the same manner as in the first to fourth embodiments, the addresses 1 to 4 which are respectively assigned to the battery monitoring devices BM1 to BM4 and the unique ID_X of the microcomputer 30 which is a host controller are respectively stored, therein. The battery monitoring devices BM1 to BM4 perform wireless communication with the microcomputer 30 on the basis of this information. In addition, a correspondence relationship between the addresses 1 to 4 and the unique ID_A to ID_D is stored in the storage region 30A of the microcomputer 30. The microcomputer 30 discriminates the addresses assigned to the respective battery monitoring devices BM1 to BM4 from each other on the basis of the correspondence relationship, and performs wireless communication with the battery monitoring devices BM1 to BM4.

According to the fifth embodiment of the present invention described above, the following operation and effect are achieved.

(5) The microcomputer 30 which is a host controller of the battery monitoring devices BM1 to BM4 transmits an address assignment command for assigning the address 1 to the battery monitoring device BM1 connected to the highest-order cell group among the battery monitoring devices BM1 to BM4 (step S410). When the address assignment command is received from the microcomputer 30, the battery monitoring device BM1 assigns the highest-order address 1 thereto (step S520), and transmits the unique ID_A and an address assignment command for the address 2 to the battery monitoring device BM2 connected to the one-order-lower battery cell group (steps S530 and S550). Meanwhile, when the address assignment command is received from the battery monitoring device BM1 (BM2) connected to the one-order-higher battery cell group, the battery monitoring device BM2 (BM3) connected to the intermediate-order cell group among the battery monitoring devices BM1 to BM4 assigns the corresponding address 2 (3) thereto, and transmits the unique ID_B (ID_C) of the battery monitoring device, the unique ID_A (unique ID_A and unique ID_B) of the higher-order battery monitoring device (s), and an assignment command for the address 3 (4), to the battery monitoring device BM3 (BM4) connected to the one-order-lower battery cell group. In addition, when the address assignment command is received from the battery monitoring device BM3 connected to the one-order-higher battery cell group, the battery monitoring device BM4 connected to the lowest-order cell group among the battery monitoring devices BM1 to BM4 assigns the lowest-order address 4 thereto, and transmits the unique ID_D of the battery monitoring device, the unique ID_A to ID_C of the respective higher-order battery monitoring devices, and an assignment command, to the microcomputer 30. The microcomputer 30 stores a correspondence relationship between the unique IDs and the addresses of the respective battery monitoring devices BM1 to BM4 in the storage region 30A on the basis of the unique ID_A to ID_D of the respective battery monitoring devices transmitted from the battery monitoring device BM4 (step S450). With this configuration, in the same manner as in the first to fourth embodiments, the microcomputer 30 which is a host controller can properly identify the information from the respective battery monitoring devices BM1 to BM4.

In the above-described respective embodiments, the correspondence relationship between the unique ID_A to ID_D and the addresses 1 to 4 of the respective battery monitoring devices BM1 to BM4 is stored in the microcomputer 30. However, as long as a battery monitoring device which is a monitoring target is correctly designated by using the addresses 1 to 4, such a correspondence relationship is not necessarily required to be stored in the microcomputer 30. In addition, a battery monitoring device which is a monitoring target may be designated by using not the addresses 1 to 4 but the unique ID_A to ID_D of the respective battery monitoring devices BM1 to BM4. In this case, the battery monitoring devices BM1 to BM4 may not store the addresses assigned thereto.

The above-described respective embodiments or various modification examples may be employed singly, and may be employed through any combination thereof.

The above-described respective embodiments or various modification examples are only an example, and the present invention is not limited to such content as long as the features of the invention are not lost.

The invention claimed is:

1. A battery monitoring system comprising:
a plurality of battery monitoring devices are connected to a battery formed by connecting a plurality of battery cell groups in series to each other, and monitor a state of the battery for the respective battery cell groups, each of the plurality of battery cell groups being formed by one or a plurality of battery cells connected in series; and
a controller that performs wireless communication with the plurality of battery monitoring devices,
wherein first identification information portions which are different from each other are set in the plurality of battery monitoring devices in advance,
wherein second identification information corresponding to an order of potentials of the battery cell groups in the battery, to which the battery monitoring devices are connected, is assigned to each of the plurality of battery monitoring devices,
wherein the controller sequentially sets communication ranges, transmission electric powers, or antenna gains for performing wireless communication with the plurality of respective battery monitoring devices in the order of potentials on the basis of information set in advance,
wherein the plurality of battery monitoring devices sequentially transmit the first identification information portions to the controller in the order of potentials in accordance with the communication ranges, the transmission electric powers, or the antenna gains,
wherein the controller determines and stores a correspondence relationship between the first identification information and the second identification information on the basis of the first identification information portions which are sequentially transmitted from the plurality of battery monitoring devices in the order of potentials,
wherein the controller further stores distances and directions from the controller to a respective one of the battery monitoring devices in correspondence with the second identification information, and
wherein the controller sequentially sets antenna gains for performing wireless communication with the plurality of respective battery monitoring devices in the order of potentials on the basis of the distances and directions.

2. A battery monitoring system comprising:
a plurality of battery monitoring devices are connected to a battery formed by connecting a plurality of battery cell groups in series to each other, and monitor a state of the battery for the respective battery cell groups, each of the plurality of battery cell groups being formed by one or a plurality of battery cells connected in series;
a controller that performs wireless communication with the plurality of battery monitoring devices; and
an inspection device that can perform wireless communication with the plurality of battery monitoring devices and the controller,
wherein first identification information portions which are different from each other are set in the plurality of battery monitoring devices in advance,
wherein second identification information corresponding to an order of potentials of the battery cell groups in the battery, to which the battery monitoring devices are connected, is assigned to each of the plurality of battery monitoring devices,
wherein the inspection device sequentially performs a reading process of reading the first identification information and an assignment process of assigning the second identification information on the plurality of respective battery monitoring devices in the order of potentials, and transmits the first identification information read due to the reading process and the second identification information assigned due to the assignment process to the controller in correlation with each other for each battery monitoring device,
wherein the controller stores a correspondence relationship between the first identification information and the second identification information on the basis of the first identification information and the second identification information transmitted from the inspection device,
wherein the controller further stores distances and directions from the controller to a respective one of the battery monitoring devices in correspondence with the second identification information, and
wherein the controller sequentially sets antenna gains for performing wireless communication with the plurality of respective battery monitoring devices in the order of potentials on the basis of the distances and directions.

3. A controller which performs wireless communication with a plurality of battery monitoring devices that are connected to a battery formed by connecting a plurality of battery cell groups in series to each other, and that monitor a state of the battery for the respective battery cell groups, each of the plurality of battery cell groups being formed by one or a plurality of battery cells connected in series,
- wherein the controller sequentially sets communication ranges, transmission electric powers, or antenna gains for performing wireless communication with the plurality of respective battery monitoring devices in an order of potentials of the battery cell groups in the battery, to which the battery monitoring devices are connected, on the basis of information set in advance, and performs wireless communication with each of the battery monitoring devices in accordance with a set result so as to assign a first identification information to each of the plurality of battery monitoring devices in the order of potentials,
- wherein the controller further stores distances and directions from the controller to a respective one of the battery monitoring devices in correspondence with a second identification information, and
- wherein the controller sequentially sets antenna gains for performing wireless communication with the plurality of respective battery monitoring devices in the order of potentials on the basis of the distances and directions.

4. The battery monitoring system of claim 1, wherein the controller sequentially sets communication ranges for performing wireless communication with the plurality of respective battery monitoring devices in the order of potentials on the basis of the distances and directions.

5. The battery monitoring system of claim 1, wherein the controller further stores transmission electric powers in correspondence with the second identification information.

6. The battery monitoring system of claim 5, wherein the controller sequentially sets transmission electric powers for performing wireless communication with the plurality of respective battery monitoring devices in the order of potentials on the basis of the stored transmission electric powers.

7. The battery monitoring system of claim 5, wherein the controller sequentially sets antenna gains for performing wireless communication with the plurality of respective battery monitoring devices in the order of potentials on the basis of the stored transmission electric powers.

* * * * *